US012272398B2

(12) United States Patent
Dubreuil et al.

(10) Patent No.: US 12,272,398 B2
(45) Date of Patent: Apr. 8, 2025

(54) THREE-DIMENSIONAL STRUCTURE OF MEMORIES FOR IN-MEMORY COMPUTING

(71) Applicant: COMMISSARIAT A L'ENERGIE ATOMIQUE ET AUX ENERGIES ALTERNATIVES, Paris (FR)

(72) Inventors: Théophile Dubreuil, Grenoble (FR); Paul Amari, Grenoble (FR); Sylvain Barraud, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 282 days.

(21) Appl. No.: 18/104,172

(22) Filed: Jan. 31, 2023

(65) Prior Publication Data

US 2023/0245698 A1 Aug. 3, 2023

(30) Foreign Application Priority Data

Feb. 3, 2022 (FR) ..................................... 2200963

(51) Int. Cl.
*G11C 11/418* (2006.01)
*G11C 13/00* (2006.01)

(52) U.S. Cl.
CPC ........ *G11C 13/004* (2013.01); *G11C 13/0026* (2013.01); *G11C 13/0028* (2013.01)

(58) Field of Classification Search
CPC .............. G11C 13/004; G11C 13/0026; G11C 13/0028; G11C 2213/71; G11C 2213/79; G11C 2213/82; G06F 15/7821
See application file for complete search history.

(56) References Cited

U.S. PATENT DOCUMENTS

| 2014/0185364 A1* | 7/2014 | Iyer ......................... G11C 8/16 365/154 |
| 2017/0263306 A1* | 9/2017 | Murphy .............. G11C 11/4091 |
| 2018/0012648 A1* | 1/2018 | Ichihashi .............. G11C 11/419 |

(Continued)

FOREIGN PATENT DOCUMENTS

CN 106 297 876 B 4/2019

OTHER PUBLICATIONS

Dubreuil, "Innovative 3D Technology of a nonvolatile memory cell for In-Memory-Computing", Nanotech Master, 2020.

(Continued)

*Primary Examiner* — Hien N Nguyen
(74) *Attorney, Agent, or Firm* — BakerHostetler

(57) ABSTRACT

An in-memory computing circuit includes a plurality of memory planes. Each plane forming a two-dimensional matrix of non-volatile, resistive and programmable memory cells. Each memory cell having a selection node, a first input/output node and a second input/output node. The computing circuit comprising at least one elementary group of memory cells comprising: a first memory cell belonging to any one of the memory planes and intended to store a first input datum; a second memory cell belonging to any one of the memory planes and intended to store a second input datum; a third memory cell belonging to a memory plane different from that of the first and of the second memory cell. The third memory cell being intended to store the result of a first logic operation with the first and second input data as operands.

15 Claims, 14 Drawing Sheets

(56) References Cited

U.S. PATENT DOCUMENTS

2019/0205273 A1* 7/2019 Kavalieros ........... H03K 19/215
2020/0335165 A1 10/2020 Liu et al.

OTHER PUBLICATIONS

Li, et al., "Four-Layer 3D Vertical RRAM Integrated with FinFET as a Versatile Computing Unit for Brain-Inspired Cognitive Information Processing", 2016 IEEE Symposium on VLSI Technology, 2016.

Sebastian, et al., "Memory devices and applications for in-memory computing", Nature Nanotechnology, vol. 15, pp. 529-544, 2020.

* cited by examiner

THREE-DIMENSIONAL STRUCTURE OF MEMORIES FOR IN-MEMORY COMPUTING

CROSS-REFERENCE TO RELATED APPLICATION

This application claims priority to foreign French patent application No. FR 2200963, filed on Feb. 3, 2022, the disclosure of which is incorporated by reference in its entirety.

FIELD OF THE INVENTION

The present invention relates to the field of designing computational memory circuits or in-memory computing circuits. More specifically, the invention relates to a non-volatile resistive memory circuit. The circuit allows elementary Boolean logic operations to be carried out within the structure of the memories forming the circuit.

BACKGROUND

In general, a system on a chip includes memory circuits for storing data and computing circuits for carrying out logic and arithmetic operations. The operations for exchanging data between the memory circuits and the computing circuits are very energy intensive and reduce the computing performance of the system. Within this context, the emerging technologies of non-volatile memories allow memory circuits to be produced that are capable of carrying out both the storage function and the computing function. In this case, this is referred to as an "in-memory computing circuit". This allows data transfers between the storage and computing means to be avoided, and thus allows the energy consumption to be reduced and the computing speed to be improved.

However, the development of "in-memory computing circuit" solutions presents several challenges and constraints, such as:

the use of large circuits peripheral to the memories for processing the results. These peripheral circuits cover, by way of an example, a plurality of sense amplifiers. This significantly increases the surface area of the circuit and the complexity of physical implementation, constraints relating to the accuracy of the computations that are carried out. More specifically, this problem arises when executing algorithms that require parallel computing.

Thus, a requirement exists for designing new architectures for in-memory computing circuits, which are less complex and at the same time have reduced electrical consumption and improved computational performance capabilities in terms of speed and accuracy.

Scientific publication [1] describes three general approaches for carrying out "in-memory computing" operations. The three approaches are based on programming operands within resistive memory cells, which in return allow sums and products to be completed by virtue of Kirchhoff's laws. The first solution is called "non-stateful logic" and the second solution is called "matrix-vector-multiplication". These two solutions require the use of large circuits peripheral to the memories in order to process the raw results. They thus have the disadvantages associated with peripheral circuits. These disadvantages include complexity of implementation, a large surface area and increased power consumption. The third solution is called "stateful logic". This solution does not require large peripheral circuits. However, it has the disadvantage of reduced computing accuracy when executing algorithms that require parallel computing operations.

Scientific publication [2] proposes an elementary resistive in-memory computing structure implemented by stacking a plurality of resistive memories controlled by a common FinFET transistor. This solution has the disadvantage of limiting the number of memories stacked in an elementary structure due to the increase in leakage currents. In addition, this solution has programming constraints because the operands and the results of a logic operation must be stored within the same elementary structure. This reduces the programming possibilities of the in-memory computing circuit and thus reduces the computational performance of the system.

SUMMARY OF THE INVENTION

In order to overcome the limitations of the existing solutions in terms of the design of in-memory computing circuits, the invention proposes a circuit based on a three-dimensional structure made up of resistive, non-volatile and programmable memory cells. In addition, the invention proposes specific programming sequences allowing elementary logic functions and data transfer functions to be carried out in a non-destructive manner. It is thus possible for a person skilled in the art to implement more complex algorithms from the elementary logic functions and from the data transfer function.

The device according to the invention allows the complexity of the peripheral circuits to be reduced by being limited to a few control transistors. The computing operations do not require the use of sense amplifier type circuits. This reduces the surface area of the circuit and its power consumption and simplifies its physical implementation.

The device according to the invention also allows operation to be achieved in all three spatial dimensions without the location constraints for storing the operands and results. This offers wider programming flexibility than the solutions where the computations are located in a single elementary structure.

The device according to the invention can be produced with a considerably larger number of memory cells than the known solutions. This offers the advantage of multiplying the storage and computing capacities at the same time. This allows a device to be obtained that is compatible with executing complex computing algorithms within the memory structure. In addition, the device is capable of simultaneously carrying out a considerable number of data processing operations in order to achieve better performance.

The invention further relates to a thin-film structure for producing the three-dimensional memory structure according to the invention. This elementary structure has the advantage of being compatible with the manufacturing techniques of the semiconductor industry. Thus, the device according to the invention has reduced production costs.

The aim of the invention is an in-memory computing circuit comprising a plurality of memory planes of rank i ranging from 1 to N, with N being a natural number greater than 1, each plane forming a two-dimensional matrix of non-volatile, resistive and programmable memory cells, each memory cell having a selection node, a first input/output node and a second input/output node. Said matrix comprising M lines of rank j ranging from 1 to M and K columns of rank k ranging from 1 to K, with M and K being two non-zero natural numbers. Said computing circuit comprising:

control means configured to control the nodes of the memory cells for carrying out storage and in-memory computing operations carried out by the computing circuit. The control means are configured to apply a predetermined sequence of electrical voltages to the nodes of the memory cells of said elementary group so as to obtain a voltage divider for carrying out the first logic operation;

at least one elementary group of memory cells comprising:
  a first memory cell belonging to any one of the memory planes and intended to store a first input datum;
  a second memory cell belonging to any one of the memory planes and intended to store a second input datum;
  a third memory cell belonging to a memory plane different from that of the first and of the second memory cell. The third memory cell being intended to store the result of a first logic operation with the first and second input data as operands.

The first, second and third memory cells belonging to columns of the same rank k in their respective matrices. The first, second and third memory cells being interconnected by a common interconnection line, particularly in order to form a resistive voltage divider bridge. Said common interconnection line connecting together the first input/output nodes (SL) of the memory cells of said elementary group or the second input/output nodes (BL) of the memory cells of said elementary group.

According to a particular aspect of the invention, for each memory plane:
  the selection nodes of the memory cells belonging to the same line are interconnected by a selection line;
  the first input/output nodes of the memory cells belonging to the same column are interconnected;
  the second input/output nodes of the memory cells belonging to the same column are interconnected.

According to a particular aspect of the invention, each memory cell comprises:
  a programmable resistive storage structure having:
    an upper electrode connected to the second input/output node of said memory cell; and
    a lower electrode;
  a selection transistor having a gate connected to the selection node of said memory cell and connecting the lower electrode to the first input/output node of said memory cell.

According to a particular aspect of the invention, each column of memory cells comprises:
  a stack of a plurality of selection transistors in a first direction; each selection transistor, in particular of the gate-all-around type, comprising a conduction channel, perpendicular to the first direction, made of a semiconductor material and having two ends;
  with the first end of the channel corresponding to the source of the selection transistor and the second end corresponding to the drain of the transistor; a first metal pillar in the first direction connecting the sources of the various selection transistors;
  a dielectric film parallel to the first direction and laterally covering the drains of the selection transistors;
  at least one metal film parallel to the first direction deposited on the dielectric film;
  a second metal pillar in the first direction having a lateral contact with the at least one metal film;
  for each selection transistor, the assembly formed by the drain, the dielectric film and the metal film forms a resistive storage structure.

According to a particular aspect of the invention, for each memory plane:
  the first input/output nodes of the memory cells belonging to the columns of odd ranks are interconnected, forming a first source line;
  the first input nodes of the memory cells belonging to the columns of even ranks are interconnected, forming a second source line;
  with the first source line and the second source line being separate.

According to a particular aspect of the invention, the elementary group of memory cells further comprises a fourth memory cell belonging to a memory plane different from that of the first, second and third memory cells. The fourth memory cell being intended to store the result of a second logic operation with the first and second input data as operands and using the result of the first logic operation stored in the third memory cell. The fourth memory cell being connected to the first, second and third memory cells via the common interconnection line.

According to a particular aspect of the invention, for each elementary group of memory cells, the interconnection line connects together the second input/output nodes of the memory cells of said elementary group.

According to a particular aspect of the invention, the first logic operation is an OR Boolean function.

According to a particular aspect of the invention, the control means are configured to carry out the following steps, in the order of the listing, in order to carry out the OR logic function:
  i—setting the third cell to a high resistive state;
  ii—selecting the first and the third memory cell by placing their selection transistors in the on-state;
  iii—applying a first positive read voltage to the first input/output node of the first memory cell and simultaneously connecting the first input/output node of the third memory cell to electrical ground;
  iv—selecting the second and the third memory cell by placing their selection transistors in the on-state;
  v—applying the first positive read voltage to the first input/output node of the first memory cell and simultaneously connecting the first input/output node of the third memory cell to electrical ground;
  with each memory cell having: a first voltage threshold in order to transition from a high resistive state to a low resistive state, and a second voltage threshold in order to transition from a low resistive state to a high resistive state greater than the first voltage threshold. Said first read voltage being positive with an amplitude greater than or equal to the first transition threshold and strictly less than the second transition threshold.

According to a particular aspect of the invention, the second logic operation is an exclusive NOR Boolean function.

According to a particular aspect of the invention, the control means are configured to carry out the following steps, in the order of the listing, in order to carry out the exclusive NOR logic function:
  vi—setting the fourth cell to a low resistive state;
  vii—selecting the first, the third and the fourth memory cell by placing their transistors in the on-state;
  viii—simultaneously carrying out the following:

a—applying a second positive read voltage to the first input/output node of the first memory cell;
b—applying a third negative read voltage to the first input/output node of the third memory cell; and
c—applying a fourth positive read voltage to the first input/output node of the fourth memory cell;
ix—selecting the second, the third and the fourth memory cell by placing their selection transistors in the on-state;
x—simultaneously carrying out the following:
a—applying the second positive read voltage to the first input/output node of the second memory cell;
b—applying the third negative read voltage to the first input/output node of the third memory cell; and
c—applying a fourth positive read voltage to the first input/output node of the fourth memory cell;
with the absolute value of the third read voltage being substantially equal to the absolute value of the second read voltage. The sum of the absolute value of the fourth read voltage and of the second read voltage being greater than the second transition threshold.

According to a particular aspect of the invention, the first logic operation is an AND Boolean function.

According to a particular aspect of the invention, the in-memory computing circuit further comprises, for each interconnection line, a regulation transistor, with each regulation transistor having a gate receiving a regulation signal and connecting the associated interconnection line to electrical ground or to a power supply voltage of the computing circuit, so as to achieve a variable impedance.

According to a particular aspect of the invention, the in-memory computing circuit comprises a plurality of elementary groups of memory cells. Each interconnection line being connected to an adjacent interconnection line by means of a switch.

According to a particular aspect of the invention, the control means are configured to transfer a stored datum from an outgoing memory cell to an incoming memory cell belonging to a plane different from that of the outgoing memory cell and connected to an interconnection line adjacent to that of the outgoing memory cell. The transfer is carried out by executing, in the order of the listing, the following steps:
i'—setting the incoming cell to a high resistive state;
ii'—placing the switch in the on-state;
iii'—simultaneously carrying out the following:
a. applying a first positive transfer voltage to the first input/output node of the outgoing memory cell;
b. connecting the first input/output node of the incoming memory cell to electrical ground;
c. applying a second positive transfer voltage to the first input/output node of the memory cell belonging to the same plane of the outgoing memory cell and connected to the same interconnection line of the incoming memory cell;
d. applying the second positive transfer voltage to the first input/output node of the memory cell belonging to the same plane of the incoming memory cell and connected to the same data line (or "bit line") of the outgoing memory cell;
with the amplitude of the second transfer voltage being less than or equal to half the first transfer voltage.

According to a particular aspect of the invention, for each elementary group of memory cells, the interconnection line connects together the first input/output nodes of the memory cells of said elementary group.

A "common interconnection line" is understood to mean a conductive line connecting the same nodes of a plurality of memory cells distributed over at least two memory planes. The connection is made directly and without an intermediary. According to a particular aspect of the invention, the common interconnection line corresponds to the common data line (or "bit line"). According to a particular aspect of the invention, the common interconnection line corresponds to the common source line.

According to a particular aspect of the invention, the in-memory circuit comprises a plurality of memory planes of rank i ranging from 1 to N, with N being an integer greater than or equal to 2.

BRIEF DESCRIPTION OF THE DRAWINGS

Further features and advantages of the present invention will become more clearly apparent from reading the following description with reference to the following accompanying drawings.

DETAILED DESCRIPTION

Figure 1A:
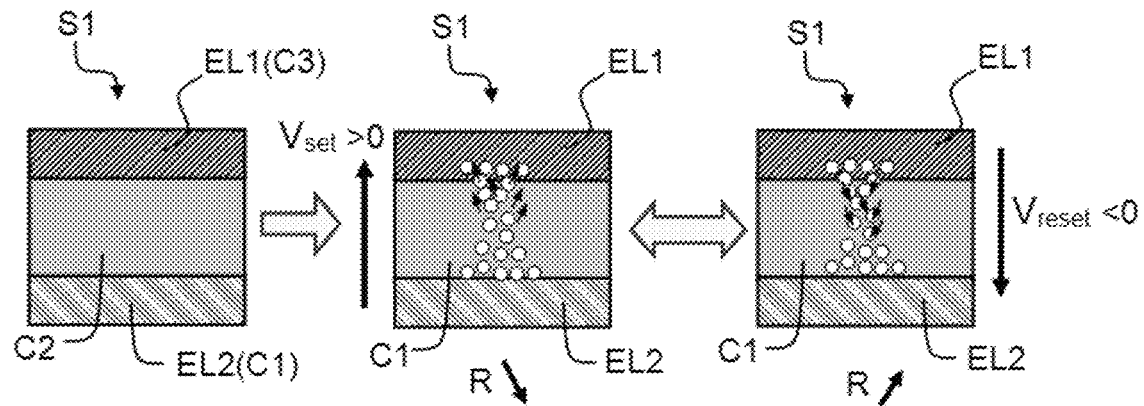
FIG. 1a illustrates a section view of a programmable resistive storage structure.

Firstly, the operating principle of a programmable resistive data storage structure will be described. FIG. 1a illustrates a section view of a programmable resistive storage structure. The storage structure S1 is made up of the stack of thin films in the following order: at least one first film C1 made of an electrically conductive material forming a lower electrode EL2; a second film C2 made of a dielectric material and at least one third film C3 made of an electrically conductive material forming an upper electrode EL1. The features of the materials forming the memory structure films NVM allow a variable conductive filament resistive in-memory operation to be achieved. The second film C2 is referred to as the "central film" throughout the remainder of the description.

Alternatively, each electrode EL1 and/or EL2 can be produced by stacking a plurality of conductive films.

By way of an example and with no loss of generality, the first film C1 (and therefore the lower electrode EL2) and the third film C3 (and therefore the upper electrode EL1) are made of titanium nitride TiN. The thickness of each film C1 (EL2) and C3 (EL1) is of the order of several tens of nanometres, more specifically equal to 100 nm.

By way of an example and with no loss of generality, the central film C2 is made of hafnium oxide. The thickness of the central film C2 is of the order of a few nanometres, more specifically equal to 10 nm.

The operation of a resistive storage structure S1 requires the formation of a conductive filament through at least part of the electrically insulating central film C2.

Initially, the storage structure S1 is an MIM (Metal, Insulator, Metal) structure exhibiting infinite resistance between the two electrodes EL1 and EL2. Firstly, the filament F must be formed through at least part of the volume of the central film C2. The formation of the filament allows a variable resistance to be obtained by modulating the length l of the formed conductive filament. In order to form the filament, a positive formation electric voltage is applied to the upper electrode EL1. The formation electric voltage has a high enough amplitude and/or duration to cause oxygen vacancies to be generated in the central film C2. Indeed, the applied formation electric voltage must exceed a predetermined value in order to pull oxygen ions out of the crystal lattice of the central film made of metal oxide. The ions will merge towards the upper electrode EL2 in order to form a conductive filament F through the central film made up of the oxygen vacancies.

Once the conductive filament F is formed, the behaviour of a variable resistance resistive element R is obtained depending on the length of the conductive filament F. When the electric potential of the upper electrode $V_{EL1}$ is lower than that of the lower electrode $V_{EL2}$, the storage structure S1 has a negative voltage $V_{reset}$ at its terminals. In this case, oxygen ions will fill some of the oxygen vacancies forming the conductive filament. This results in a reduction in the length of the conductive filament. Thus, the resistance of the resistive element increases. This is referred to as a high resistive state and a RESET type writing operation. Conversely, when the electric potential of the upper electrode $V_{EL1}$ is greater than that of the lower electrode $V_{EL2}$, the storage structure S1 has a positive voltage $V_{set}$ at its terminals. The length of the conductive filament F increases by the same mechanism described for the wire forming operation. Thus, the resistance of the resistive element decreases. This is referred to as a low resistive state and a SET type writing operation.

The applied voltage $V_{set}$ must be greater as an absolute value than a first voltage threshold in order to transition from a high resistive state to a low resistive state. Similarly, the applied voltage $V_{reset}$ must be greater as an absolute value than a second voltage threshold in order to transition from a low resistive state to a high resistive state.

The following convention is selected by way of an example: when the storage structure S1 is configured to store a binary datum in the high logic state (x=1), it is in a low resistive state. Conversely, when the storage structure S1 is configured to store a binary datum in a low logic state (x=0), it is in a high resistive state. A reverse convention is also possible.

Figure 1B:
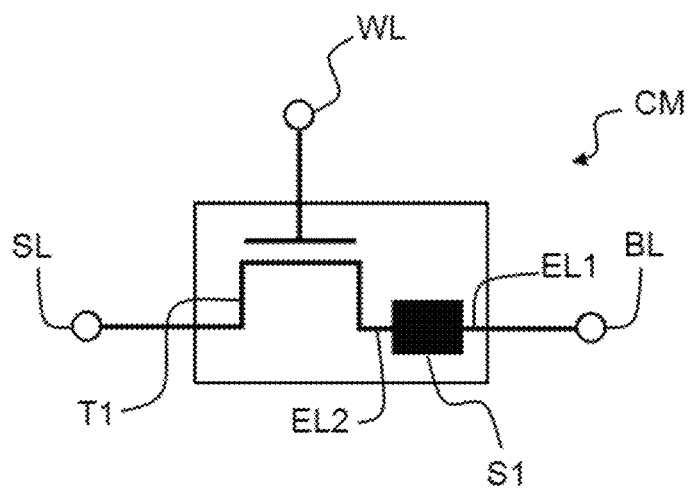
FIG. 1b illustrates a memory cell used to produce the in-memory computing circuit according to the invention.

FIG. 1b illustrates an electrical diagram of a memory cell CM according to the invention. The memory cell CM comprises a memory structure S1 and a selection transistor T1. The memory cell CM further comprises a selection node WL, a first input/output node SL and a second input/output node BL. The upper electrode EL1 of the storage structure S1 is connected to the second input/output node BL of the memory cell CM. The selection node WL is intended to receive a selection signal VWL. The gate of the transistor T1 is connected to the selection node WL. The transistor T2 is mounted so as to connect the lower electrode EL2 to the first input/output node SL. Thus, the memory cell CM can only be written as SET or RESET when the transistor T1 is in the on-state. In addition, the transistor T1 allows the current flowing through the storage structure S1 to be limited during a SET operation. Limiting the current protects the structure S1 from the risk of internal structural destruction due to the presence of high potential currents when transitioning from a high resistive state to a low resistive state.

Generally, within the scope of the invention OxRAM, CbRAM type memory cells or any other non-volatile resistive memory technology can be produced.

In general, the invention relates to an in-memory computing circuit comprising a plurality of memory planes of rank i from 1 to N, with N being a natural number greater than 1. Each plane forms a two-dimensional matrix of memory cells CM as described above. Each matrix comprises M lines and K columns of memory cells. This results in a three-dimensional memory structure. The three-dimensional memory structure according to the invention is characterized by the implementation of at least one elementary group of a plurality of memory cells capable of carrying out at least one logic operation. Hereafter, a plurality of non-limiting examples of embodiments of elementary groups of memory cells will be described.

Figure 2A:
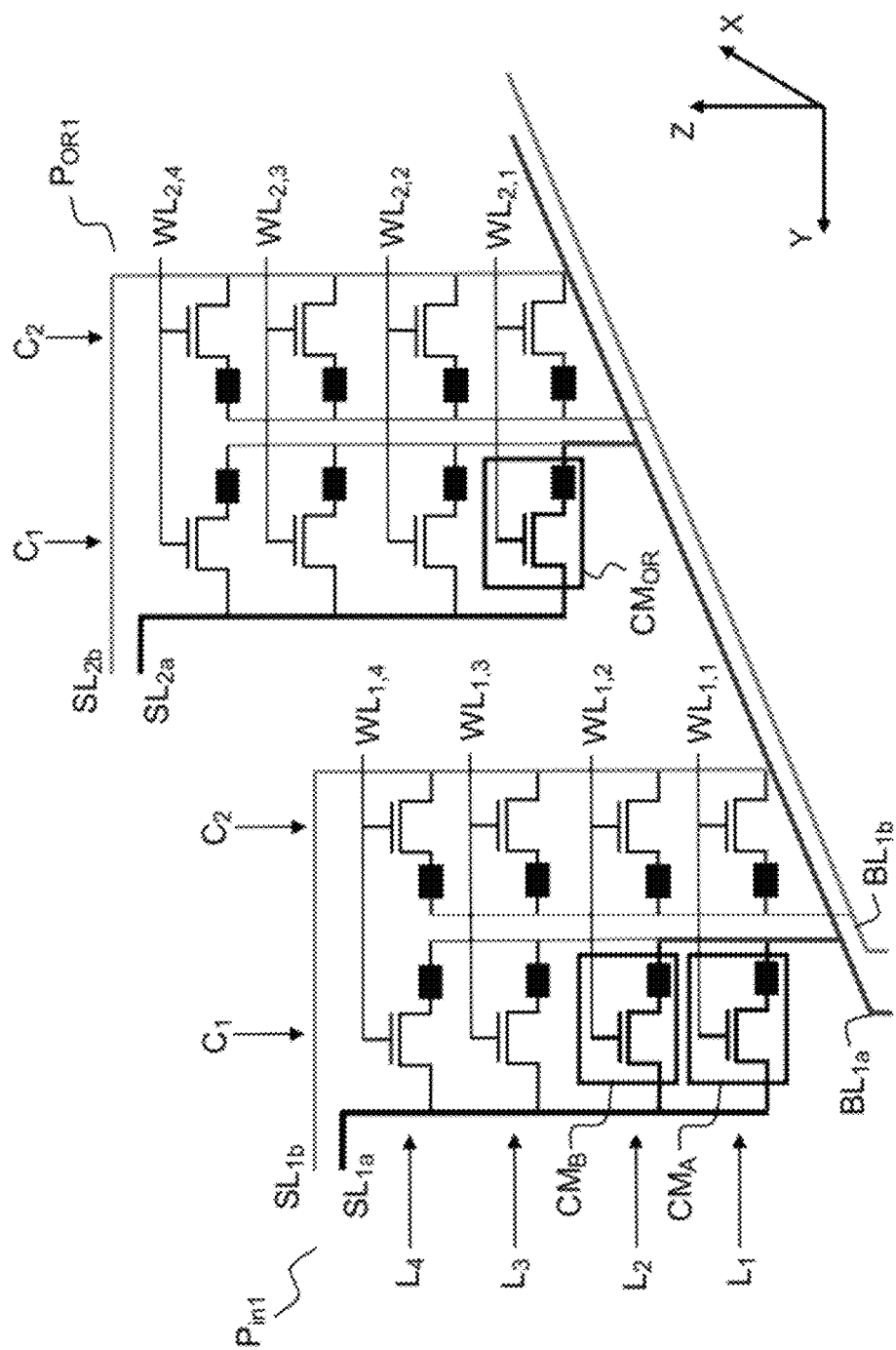
FIG. 2a illustrates an elementary group of memory cells according to a first embodiment of the invention intended to carry out the A OR B logic operation.

FIG. 2a illustrates an elementary group of memory cells according to a first embodiment of the invention intended to carry out the A OR B logic operation. The elementary group is made up of three memory cells $CM_A$, $CM_B$, $CM_{OR}$. The first memory cell $CM_A$ belongs to the memory plane $P_{in1}$ and it is intended to store a first input datum A. The second memory cell $CM_B$ belongs to the memory plane $P_{in1}$ and it is intended to store a second input datum B. The third memory cell $CM_{OR}$ belongs to a memory plane $P_{OR1}$ different from the memory plane $P_{in1}$. The third memory cell is intended to store the result of the A OR B logic operation.

In the illustrated example, each of the memory planes $P_{in1}$ and $P_{OR1}$ is a matrix of memory cells with four lines ($L_1$, $L_2$, $L_3$, $L_4$) and two columns ($C_1$, $C_2$). In each memory plane:
  the selection nodes WL of the memory cells belonging to the same line $L_j$ are interconnected by a selection line $WL_{ij}$;
  the first input/output nodes SL of the memory cells belonging to the same column $C_k$ are interconnected through a common source line;
  the second input/output nodes BL of the memory cells belonging to the same column $C_k$ are interconnected by a common data line (or "bit line").

Thus, each memory plane comprises M selection lines $WL_{ij}$ (with M being the number of lines per plane), K source lines and K data lines (with K being the number of columns per plane).

In the illustrated elementary group, the first memory cell $CM_A$, the second memory cell $CM_B$ and the third memory cell $CM_{OR}$ all belong to columns of the same rank k in their respective matrices. The second input/output nodes BL of the first, second and third memory cells $CM_A$, $CM_B$ and $CM_{OR}$ are interconnected by a common interconnection line $BL_{1a}$. The common interconnection line in this case corresponds to the data line (or "bit line") of the memory cells $CM_A$, $CM_B$ and $CM_{OR}$. This specific arrangement combined with the application of a specific voltage sequence on the nodes of said cells allows the A OR B logic function to be carried out in the third cell.

Alternatively, the two input cells $CM_A$ and $CM_B$ can be implemented in two distinct memory planes, provided that they belong to columns of the same rank k.

Thus, the elementary group is controlled via the following nodes: the first input/output node common to $CM_A$ and $CM_B$, denoted $SL_{1a}$, the first input/output node of $CM_{OR}$, denoted $SL_{2a}$, and the three selection nodes ($WL_{1,1}$, $WL_{1,2}$ $WL_{2,1}$).

Advantageously, another elementary group of symmetrical memory cells can be produced on the second columns $C_2$ of the planes $P_{in1}$ and $P_{OR1}$. This allows two OR logic operations to be carried out on two different pairs of operands at the same time.

Figure 2B:
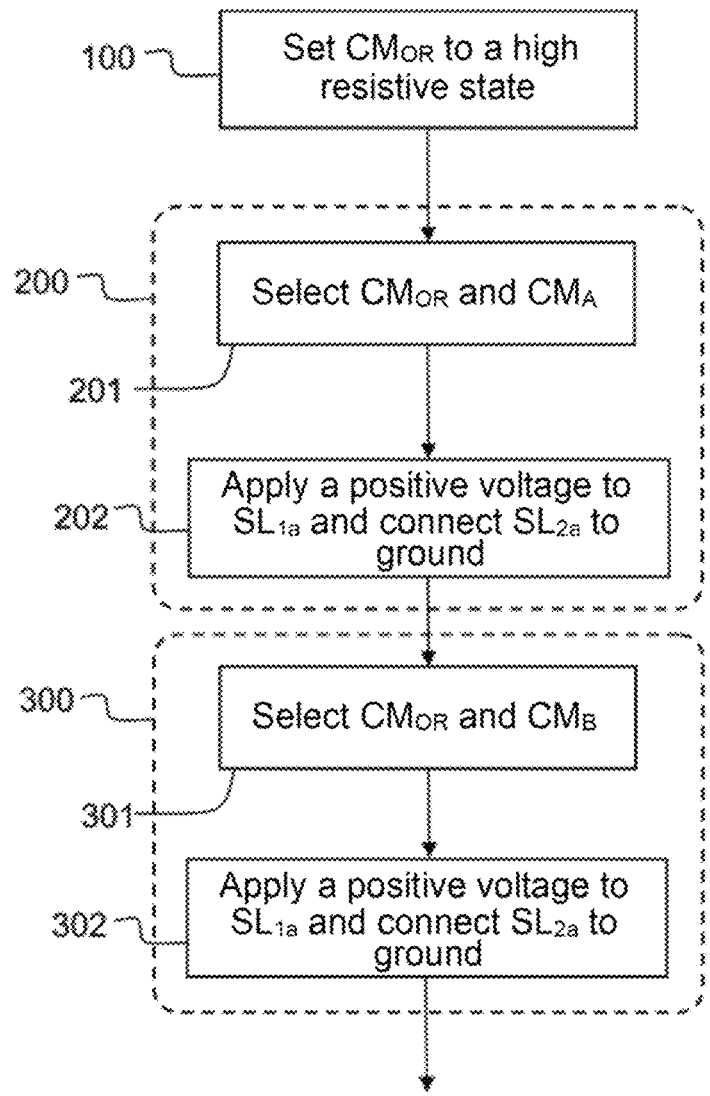
FIG. 2b illustrates the steps for carrying out the A OR B logic operation with the elementary group of memory cells according to the first embodiment of the invention.

FIG. 2b illustrates the steps for carrying out the A OR B logic operation with the elementary group of memory cells according to the first embodiment of the invention.

The first step 100 involves setting the third cell $CM_{OR}$ to a high resistive state corresponding to a low logic state x=0.

Then, a first computing cycle 200 is triggered. The cycle 200 includes a first step 201 involving selecting the first memory cell $CM_A$ and the third memory cell $CM_{OR}$ by placing their selection transistors T1 in the on-state. The second step 202 of the cycle 200 involves applying a first positive read voltage to the first input/output node $SL_{1a}$ of the first memory cell and simultaneously connecting the first input/output node $SL_{2a}$ of the third memory cell to electrical ground.

The amplitude of the first positive read voltage applied to the node $SL_{1a}$ is strictly less than the second voltage threshold $V_{reset}$ in order to transition from a low resistive state to a high resistive state. This ensures the preservation of the resistive state of the first memory cell $CM_A$ containing the first input datum. Two specific cases are possible for this configuration:

In the first case, the first cell $CM_A$ is considered to be in a low resistive state (A=1). This implies that the voltage drop through said memory cell is low. The first memory cell $CM_A$ is akin to a switch in the on-state. The applied voltage is propagated towards the second input/output node BL of the third memory cell $CM_{OR}$ by means of the common interconnection line $BL_{1a}$. Thus, the third memory cell $CM_{OR}$ is left with a positive voltage on the upper electrode EL1 connected to the interconnection line $BL_{1a}$, and with a zero voltage on the lower electrode EL2 connected to ground through the associated transistor T1 in the on-state. The third memory cell $CM_{OR}$ is thus subjected to a positive voltage at its terminals. The amplitude of the first positive read voltage applied to node $SL_{1a}$ is strictly greater than the first voltage threshold $V_{set}$ in order to transition from a high resistive state to a low resistive state. Thus, the third memory cell $CM_{OR}$ transitions from a high resistive state (x=0) to a low resistive state (x=1) when (A=1).

By way of an example, for a given resistive memory technology, the first voltage threshold $V_{set}$ is equal to 1.5 V and the second voltage threshold $V_{reset}$ is equal to 2 V. The amplitude of the first positive read voltage applied to node $SL_{1a}$ is equal to 1.8 V. The first read voltage $VSL_{1a}$ is in the form of a rectangular pulse with a duration of 100 ns, by way of an example.

In the second case, the first cell $CM_A$ is considered to be in a high resistive state (A=0). This implies that the voltage drop through said memory cell is high. The first memory cell $CM_A$ is akin to a switch in the off-state. The third memory cell $CM_{OR}$ is left with a positive voltage close to zero on the upper electrode EL1 and with a zero voltage on the lower electrode EL2 connected to ground through the associated transistor T1 in the on-state. The third memory cell $CM_{OR}$ is thus subjected to a low voltage at its terminals, which is not sufficient to cause a change of resistive state. Thus, the third memory cell $CM_{OR}$ remains in its initially high resistive state (x=0) when (A=0).

Next, a second computing cycle 300 is triggered. The cycle 300 includes a first step 301 involving selecting the second memory cell $CM_B$ and the third memory cell $CM_{OR}$ by placing their selection transistors T1 in the on-state. The second step 302 of the cycle 300 involves applying the first positive read voltage to the first input/output node $SL_{1a}$ of the second memory cell and simultaneously connecting the first input/output node $SL_{2a}$ of the third memory cell to electrical ground. This is a reiteration of the cycle 200 but selecting the second memory cell $CM_B$ containing the second input datum B. Thus, using the same mechanism described in the first cycle 200, if the second memory cell $CM_B$ is in a low resistive state (B=1), then the third memory cell $CM_{OR}$ transitions to a low resistive state (x=1). If the second memory cell $CM_B$ is in a high resistive state (B=0), then the third memory cell $CM_{OR}$ remains in a high resistive state (x=0).

The following logic function is thus obtained from the preceding sequence of steps: the third memory cell $CM_{OR}$ remains in a high resistive state (x=0) if and only if the first $CM_A$ and the second $CM_B$ memory cells are both in a high resistive state (A=0 and B=0). This corresponds to the A OR B logic function as illustrated in the logic table of FIG. 2b.

Figure 3A:
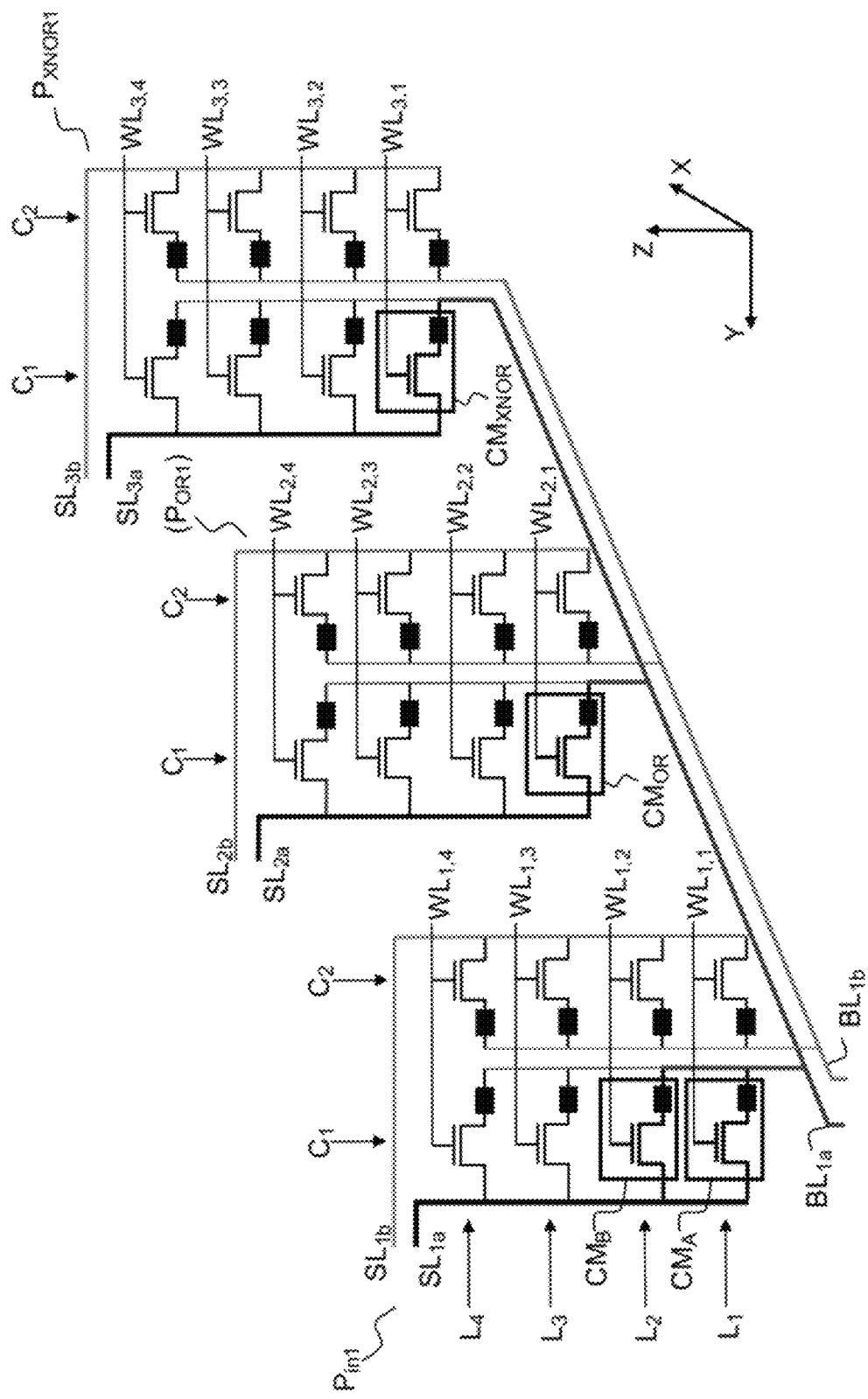
FIG. 3a illustrates an elementary group of memory cells according to a second embodiment of the invention intended to carry out the A XNOR B logic operation.

FIG. 3a illustrates an elementary group of memory cells according to a second embodiment of the invention intended to carry out the A XNOR B logic operation. The second embodiment adopts the same structure of the elementary group according to the first embodiment and further comprises a fourth memory cell $CM_{XNOR}$. The fourth memory cell $CM_{XNOR}$ belongs to a memory plane $P_{XNOR1}$ different from that of the memory planes $P_{in1}$ and $P_{OR1}$. The fourth memory cell is intended to store the result of the logic function (A XNOR B). The first input datum A stored in $CM_A$, the second input datum B stored in $CM_B$ and the result of (A OR B) previously computed and stored in $CM_{OR}$ are used to compute A XNOR B in $CM_{XNOR}$.

The second input/output node BL of the fourth memory cell $CM_{XNOR}$ is connected to the second input/output nodes BL of the first, of the second and of the third memory cell, $CM_A$, $CM_B$ and $CM_{OR}$, by means of the common interconnection line $BL_{1a}$.

The fourth memory cell $CM_{XNOR}$ belongs to column $C_1$ in the matrix of the plane $P_{XNOR1}$. This is the column with the same rank as the memory cells $CM_A$, $CM_B$ and $CM_{OR}$. This allows the interconnection to be simplified between the second input/output nodes BL of said memory cells through the interconnection line $BL_{1a}$.

The elementary group of memory cells according to the second embodiment of the invention is configurable via: the first input/output node common to $CM_A$ and $CM_B$, denoted $SL_{1a}$, the first input/output node of $CM_{OR}$, denoted $SL_{2a}$, the first input/output node of $CM_{XNOR}$, denoted $SL_{3a}$, and the four selection nodes ($WL_{1,1}$, $WL_{1,2}$ $WL_{2,1}$ $WL_{3,1}$).

Advantageously, another elementary group of symmetrical memory cells can be produced on the second columns $C_2$ of planes $P_{in1}$ and $P_{OR1}$. This allows two OR logic operations to be carried out on two different pairs of operands at the same time.

Figure 3B:
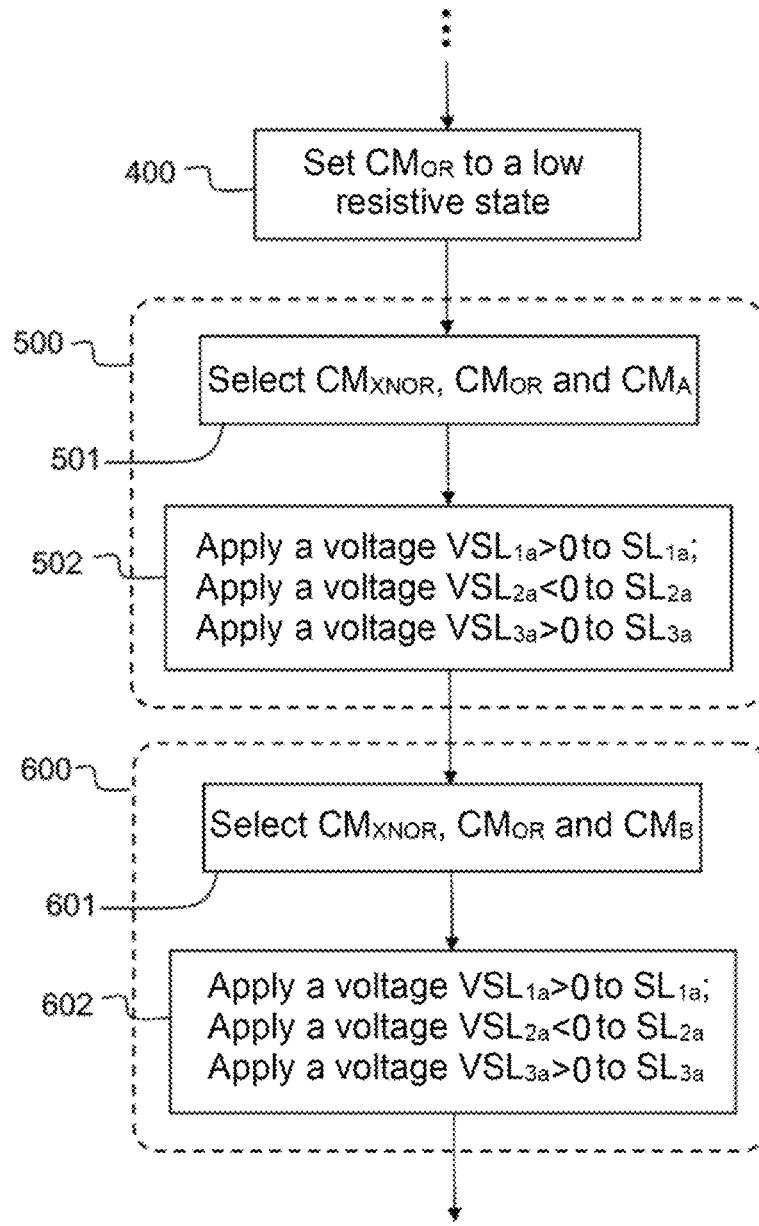
FIG. 3b illustrates the steps for carrying out the A XNOR B logic operation with the elementary group of memory cells according to the second embodiment of the invention.

FIG. 3b illustrates the steps for carrying out the (A XNOR B) logic operation with the elementary group of memory cells according to the second embodiment of the invention. In order to carry out this computation, the result of the (A OR B) logic operation must be previously computed and stored in the third memory cell $CM_{OR}$. To this end, it is possible to execute the steps of the method described for the elementary group according to the first embodiment of the invention described above. It is also possible to write the value of the (A OR B) logic operation in the third memory cell $CM_{OR}$ from an external computer.

The first step 400 involves setting the fourth cell $CM_{XNOR}$ to a low resistive state corresponding to a high logic state x=1.

Then, a first computing cycle 500 is triggered. The cycle 500 includes a first step 501 involving selecting the first memory cell $CM_A$, the third memory cell $CM_{OR}$ and the fourth memory cell $CM_{XNOR}$ by placing their selection transistors T1 in the on-state. The second step 502 of the cycle 500 involves simultaneously carrying out the following:

applying a second positive read voltage $VSL_{1a}$ to the first input/output node $SL_{1a}$ of the first memory cell $CM_A$;

applying a third negative read voltage $VSL_{2a}$ to the first input/output node $SL_{2a}$ of the third memory cell $CM_{OR}$; and applying a fourth positive read voltage $VSL_{3a}$ to the first input/output node $SL_{3a}$ of the fourth memory cell $CM_{XNOR}$.

The absolute value of the second positive read voltage $VSL_{1a}$ is substantially equal to that of the third negative read voltage $VSL_{2a}$. Advantageously, the absolute value of the second positive read voltage $VSL_{1a}$ is slightly higher than that of the third negative read voltage $VSL_{2a}$. The difference as an absolute value between $VSL_{1a}$ and $VSL_{2a}$ ranges between 0% and 40% of the absolute value of the third read voltage $VSL_{2a}$. More specifically, the difference as an absolute value between $VSL_{1a}$ and $VSL_{2a}$ ranges between 25% and 35% of the absolute value of the third read voltage $VSL_{2a}$. Moreover, the amplitude of the fourth positive read voltage $VSL_{3a}$ is strictly lower than the second voltage threshold $V_{reset}$ in order to transition from a low resistive state to a high resistive state. Three cases are possible for this configuration:

In the first case, the first cell $CM_A$ is considered to be in a low resistive state (A=1) and the third cell $CM_{OR}$ is considered to be in a low resistive state (A OR B=1). The first memory cell $CM_A$ is akin to a switch in the on-state. The second positive read voltage $VSL_{1a}$ is propagated towards the second input/output node BL of the fourth memory cell $CM_{XNOR}$ by means of the common interconnection line $BL_{1a}$. Similarly, the third memory cell $CM_{OR}$ is akin to a switch in the on-state. The third negative read voltage $VSL_{2a}$ is propagated towards the second input/output node BL of the fourth memory cell $CM_{XNOR}$ by means of the common interconnection line $BL_{1a}$. By applying the mesh law, the node BL of the fourth cell $CM_{XNOR}$ exhibits a potential equal to the algebraic sum of $VSL_{2a}$ and $VSL_{1a}$, which is a few mV. Thus, the following equation is obtained:

$$VBL_{1a} = VSL_{1a} + VSL_{2a} \approx 0V$$

Thus, the fourth memory cell $CM_{XNOR}$ has the following voltage at its terminals:

$$V_{XNOR} = VBL_{1a} - VSL_{3a} = (VSL_{1a} + VSL_{2a}) - VSL_{3a} \approx -VSL_{3a} < 0;$$

with $|VSL_{3a}| < V_{RESET}$

The fourth memory cell $CM_{XNOR}$ is thus subjected to a negative voltage $V_{XNOR}$ at its terminals. The amplitude of the negative voltage $V_{XNOR}$ is not high enough to exceed the second voltage threshold $V_{reset}$ in order to transition from a low resistive state to a high resistive state. Thus, the fourth memory cell $CM_{XNOR}$ remains in a low resistive state (x=1) when (A=1) and (A OR B=1).

In the second case, the first cell $CM_A$ is considered to be in a high resistive state (A=0) and the third cell $CM_{OR}$ is considered to be in a high resistive state (A OR B=0). None of the read voltages $VSL_{2a}$ and $VSL_{1a}$ are propagated towards the node BL of the fourth memory cell $CM_{XNOR}$. The fourth memory cell $CM_{XNOR}$ thus remains in its original resistive state. The fourth memory cell $CM_{XNOR}$ remains in a low resistive state (x=1) when (A=0) and (A OR B=0).

In the third case, the first cell $CM_A$ is considered to be in a high resistive state (A=0) and the third cell $CM_{OR}$ is considered to be in a low resistive state (A OR B=1). The first memory cell $CM_A$ is akin to a switch in the off-state. The second positive read voltage $VSL_{1a}$ is not propagated towards the second input/output node BL of the fourth memory cell $CM_{XNOR}$. Similarly, the third memory cell $CM_{OR}$ is akin to a switch in the on-state. The third negative read voltage $VSL_{2a}$ is propagated towards the second input/output node BL of the fourth memory cell $CM_{XNOR}$ by means of the common interconnection line $BL_{1a}$. Thus, the following equation is obtained:

$$VBL_{1a} = VSL_{2a} < 0V$$

Thus, the fourth memory cell $CM_{XNOR}$ has the following voltage at its terminals:

$$V_{XNOR} = VBL_{1a} - VSL_{3a} = VSL_{2a} - VSL_{3a} < 0;$$

with $|V_{XNOR}| = |VSL_{2a}| + |VSL_{3a}| > V_{RESET}$

The third memory cell $CM_{OR}$ is thus subjected to a negative voltage $V_{XNOR}$ at its terminals. The amplitude of the negative voltage $V_{XNOR}$ is high enough to exceed the second voltage threshold $V_{reset}$. Thus, the fourth memory cell $CM_{XNOR}$ transitions from a low resistive state to a high resistive state (x=0) when (A=0) and (A OR B=1).

Then, a second computing cycle 600 is triggered. The cycle 600 is a reiteration of the cycle 500 but selecting the second memory cell $CM_B$ containing the second input datum B instead of the first memory cell $CM_A$. Thus, by the same mechanism described in the first cycle 600, the following three cases are obtained: the fourth memory cell $CM_{XNOR}$ transitions from a low resistive state to a high resistive state (x=0) when (B=0) and (A OR B=1), otherwise the fourth memory cell $CM_{XNOR}$ remains in a low resistive state (x=1).

Thus, the following logic function is obtained from the preceding sequence of steps: the fourth memory cell $CM_{XNOR}$ transitions to a low resistive state (x=1) if and only if the first $CM_A$ and the second $CM_B$ memory cells have opposing resistive states (A=0 and B=1 or A=1 and B=0). This corresponds to the A XNOR B logic function as illustrated in the logic table in FIG. 3b.

By way of an example, for a given resistive memory technology, the first voltage threshold $V_{set}$ is equal to 1.8 V and the second voltage threshold $V_{reset}$ is equal to 2 V. The second read voltage $VSL_{1a}$ is equal to 1 V. The third read voltage $VSL_{2a}$ is equal to −0.75 V. The fourth read voltage $VSL_{3a}$ is equal to 1.5 V. The read voltages $VSL_{1a}$, $VSL_{2a}$ and $VSL_{3a}$ are in the form of rectangular pulses with a duration of 100 ns, by way of an example.

Advantageously, the selection voltage $VWL_{3,1}$ applied to the gate of the transistor T1 of the fourth memory cell $CM_{XNOR}$ is lower than the general power supply voltage VDD. This allows the current through the memory cell to be limited during a transition. Thus, the memory cell is protected from the risk of damage due to the presence of high currents during a change in its resistive state.

Figure 4:
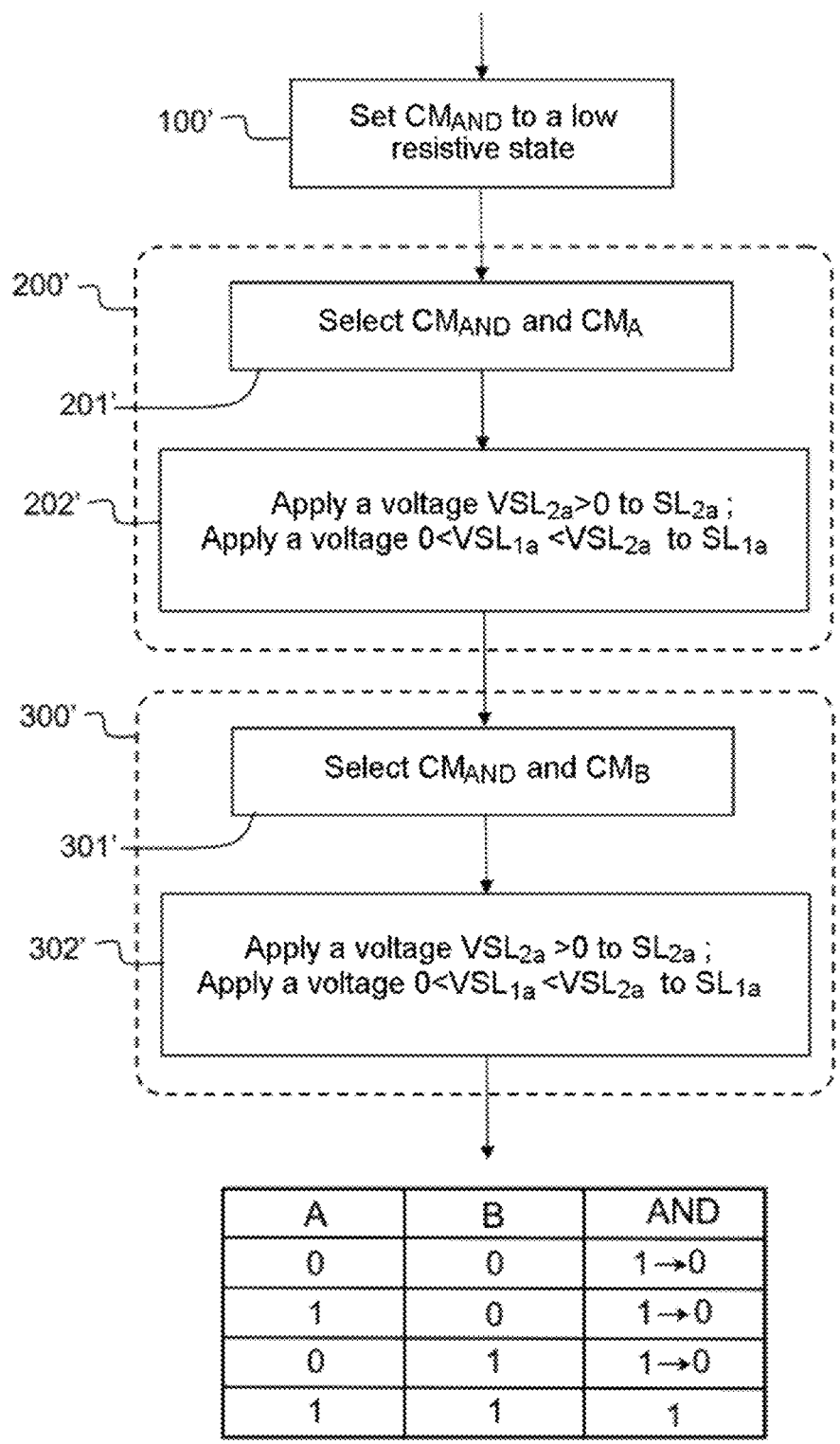
FIG. 4 illustrates the steps for carrying out the A AND B logic operation with the elementary group of memory cells according to the first embodiment of the invention.

In addition, it is possible to carry out the (A AND B) logic function using the elementary group of memory cells according to the first embodiment. FIG. 4 illustrates the steps for carrying out the (A AND B) logic operation with the elementary group of memory cells according to the first embodiment of the invention. In this illustration, the third memory cell is intended to store the result of the (A AND B) logic operation and is referred to as $C_{AND}$ instead of $C_{OR}$. The connection between the three memory cells remains unchanged compared to FIG. 2a.

The first step 100' involves setting the third cell $CM_{AND}$ to a low resistive state corresponding to a high logic state x=1.

Then, a first computing cycle 200' is triggered. The cycle 200' includes a first step 201' involving selecting the first memory cell $CM_A$ and the third memory cell $CM_{AND}$ by placing their selection transistors T1 in the on-state. The second step 202' of the cycle 200 involves applying a first positive read voltage $VSL_{1a}$ to the first input/output node $SL_{1a}$ of the first memory cell and applying a second positive read voltage $VSL_{2a}$ to the third input/output node $SL_{2a}$ of the third memory cell $CM_{AND}$.

The amplitude of the first read voltage $VSL_{1a}$ is strictly less than the second voltage threshold $V_{reset}$ in order to transition from a low resistive state to a high resistive state. This ensures that the resistive state of the first memory cell $CM_A$ containing the first input datum is maintained. The amplitude of the second read voltage $VSL_{2a}$ is strictly higher than the second voltage threshold $V_{reset}$ in order to transition from a low resistive state to a high resistive state. Two specific cases are possible for this configuration:

In the first case, the first cell $CM_A$ is considered to be in a low resistive state (A=1). This implies that the voltage drop through said memory cell is low. The first memory cell $CM_A$ is akin to a switch in the on-state. The applied voltage is propagated towards the second input/output node BL of the third memory cell $CM_{AND}$ by means of the common interconnection line $BL_{1a}$. Thus, the third memory cell $CM_{AND}$ has the following voltage at its terminals:

$$V_{AND} = VBL_{1a} - VSL_{2a} \approx VSL_{1a} - VSL_{2a} < 0;\text{ with}$$
$$|V_{AND}| < V_{RESET}$$

The third memory cell $CM_{AND}$ is thus subjected to a negative voltage $V_{AND}$ at its terminals. The amplitude of the negative voltage $V_{AND}$ is not high enough to exceed the second voltage threshold $V_{reset}$ and transition from a low resistive state to a high resistive state. Thus, the third memory cell $CM_{AND}$ remains in a low resistive state (x=1) when (A=1).

In the second case, the first cell $CM_A$ is considered to be in a high resistive state (A=0). This implies that the voltage drop through said memory cell is high. The first memory cell $CM_A$ is akin to a switch in the off-state. The second input/output node BL of the third memory cell $CM_{AND}$ has a positive voltage $VBL_{1a}$ close to zero. Thus, the third memory cell $CM_{AND}$ has the following voltage at its terminals:

$$V_{AND} = VBL_{1a} - VSL_{2a} \approx 0 - VSL_{2a} < 0;\text{ with}$$
$$|V_{AND}| > V_{RESET}\text{ as }VBL_{1a} \approx 0$$

The third memory cell $CM_{AND}$ is thus subjected to a negative voltage $V_{AND}$ at its terminals. The amplitude of the negative voltage $V_{AND}$ is high enough to exceed the second voltage threshold $V_{reset}$. Thus, the third memory cell $CM_{AND}$ transitions to a high resistive state (x=0) when (A=0).

Next, a second computing cycle 300' is triggered. The cycle 300' is a reiteration of the cycle 200' but selecting the second memory cell $CM_B$ containing the second input datum B instead of the first memory cell $CM_A$. Thus, by the same mechanism described in the first cycle 200', the following two cases are obtained: the third memory cell $CM_{AND}$ transitions from a low resistive state to a high resistive state (x=0) when (B=0), otherwise the third memory cell $CM_{AND}$ remains in a low resistive state (x=1).

Thus, the following logic function is obtained from the preceding sequence of steps: the third memory cell $CM_{AND}$ remains in a low resistive state (x=1) if and only if the first $CM_A$ and the second $CM_B$ memory cells are both in a low resistive state (A=1 and B=1). This corresponds to the A AND B logic function as illustrated in the logic table of FIG. 4.

Figure 5A:
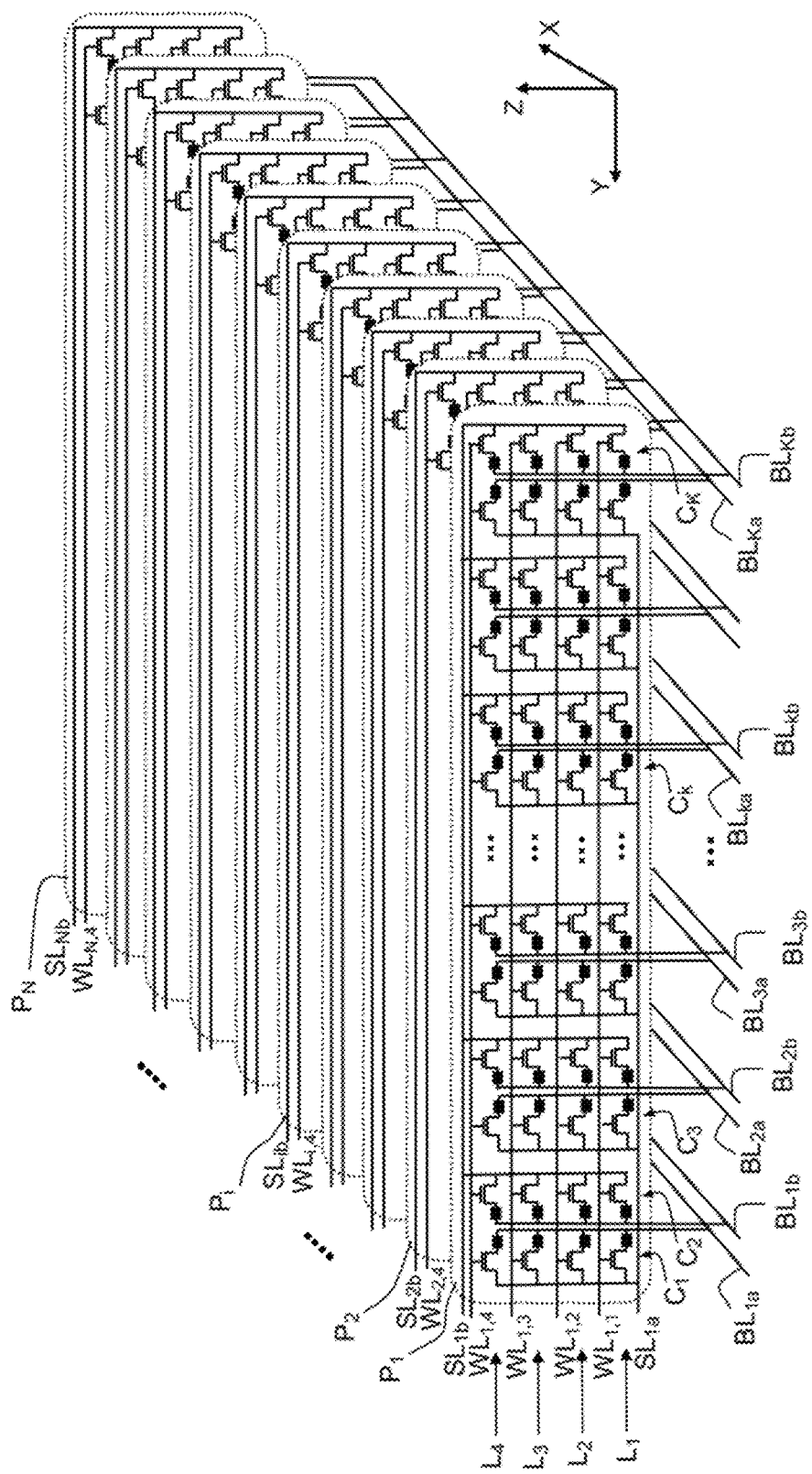
FIG. 5a illustrates a first embodiment of the in-memory computing circuit according to the invention.

FIG. 5a illustrates a first embodiment of the in-memory computing circuit 10 according to the invention. The computing circuit 10 comprises a plurality of successive memory planes $P_i$ of ranks i from 1 to N, with N being a natural number greater than 1. Each memory plane forms a two-dimensional matrix of memory cells CM according to the invention. Each matrix comprises M lines $L_i$ and K columns $C_k$. By way of an illustrative example, the number of lines per matrix is equal to 4.

In each memory plane $P_i$, the selection nodes WL of the memory cells belonging to the same line $L_i$ are interconnected by a common selection line $WL_{ij}$.

In each memory plane $P_i$, the first input/output nodes SL of the memory cells belonging to the same column $C_k$ are interconnected. In addition, the first input/output nodes SL of the memory cells belonging to the columns $C_k$ of odd ranks are interconnected, forming a first source line $SL_{1a}$, with i being from 1 to N. Furthermore, the first input/output nodes SL of the memory cells belonging to the columns $C_k$ of even ranks are interconnected, forming a second source line $SL_{ib}$, with i being from 1 to N.

In each memory plane $P_i$, the second input/output nodes BL of the memory cells belonging to the same column $C_k$ are interconnected. The memory cells belonging to columns of the same rank across all the memory planes $P_i$ form a plane parallel to the geometrical plane (X, Z). The second input/output nodes BL belonging to the same plane (X, Z) are interconnected by means of a common interconnection line. By way of an example, the memory cells of the columns of rank 1 of all the memory planes are interconnected via the interconnection line $BL_{1a}$. The memory cells of the columns of rank 2 of all the memory planes are interconnected via the interconnection line $BL_{1b}$.

A three-dimensional structure of non-volatile memories is thus obtained comprising a plurality of elementary groups according to the invention capable of carrying out OR, AND type logic operations and any other logic operation that can be carried out from the elementary OR and AND operations.

Advantageously, it is possible to dedicate a plane $P_i$ for storing the input operands. It is possible to dedicate any plane $P_{i'}$ of the structure to store the results of a logic operation implementing the various combinations of the input operands. This provides programming flexibility that the conventional in-memory computing circuit structures do not have.

In general, the computing circuit 10 according to the invention has the following advantage: all the cells of the same plane (XZ) have the same common interconnection line $BL_{ia}$. Thus, any memory cell CM of this plane (XZ) can be used to store an operand. The result can be stored in any other memory cell of the plane (XZ), except for the columns containing the input data. This affords considerable freedom for programming and storing data in the computing circuit 10.

Furthermore, when a logic operation is carried out at the same time on all the planes (XZ), any memory cell can be opened or closed by virtue of an independent selection node $WL_{ij}$. Since the selection lines $WL_{ij}$ are independent within the same plane (XZ), all the cells not used during a logic operation will be closed. This allows the leakage currents to be limited in the columns of rank j across all the memory planes $P_i$. By way of an example, the transistors T1 are of the gate-all-around type if the memory cells are of the OxRAM type. This limits the leakage currents per memory cell CM to $10^{-11}$ A. It is then possible to implement 107 memory cells inside the same plane (XZ). This results in a considerable increase in the storage and computing capacities integrated in the memory structure compared to the solutions of the prior art.

Figure 5B:
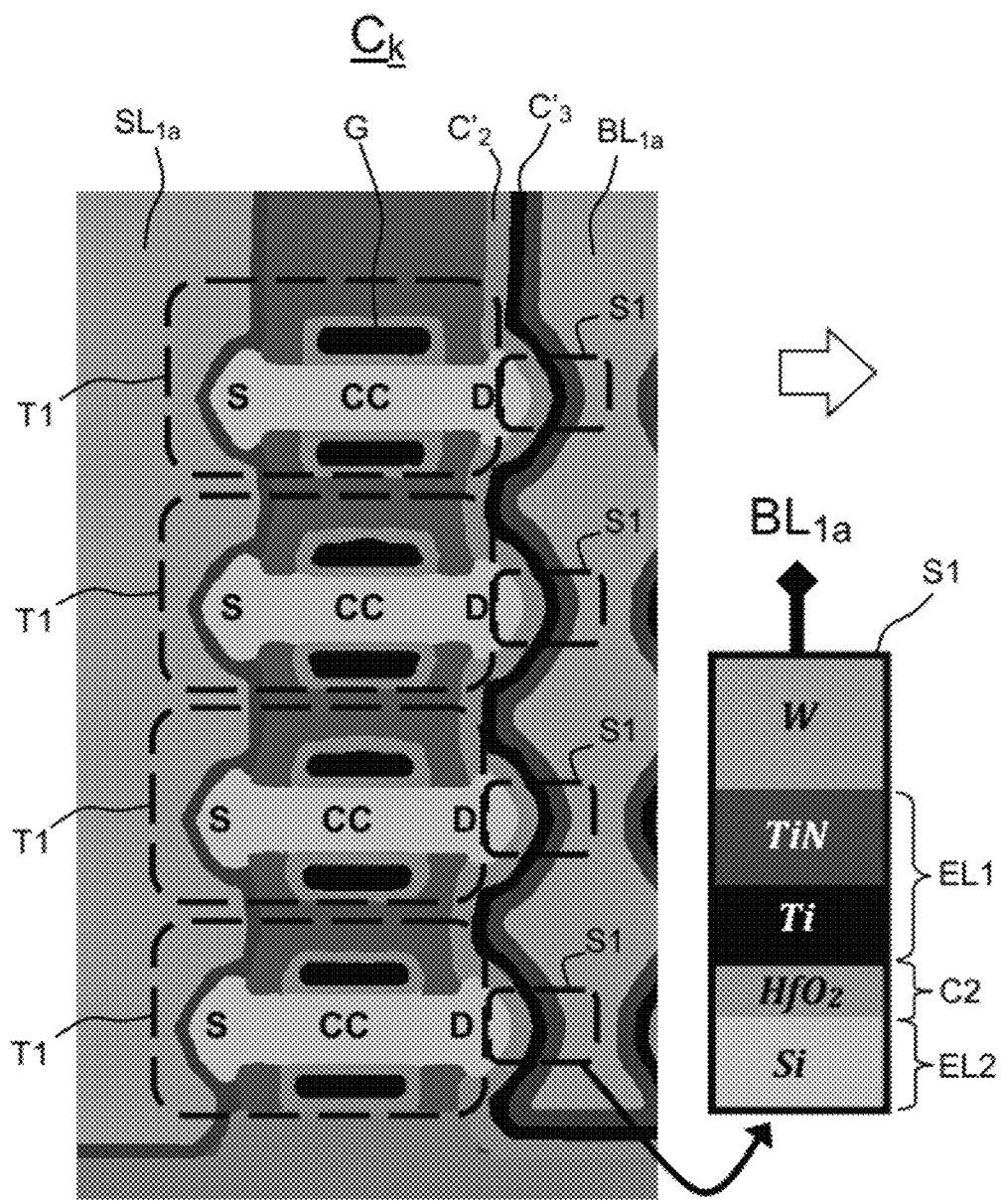
FIG. 5b illustrates a section view of the thin-film structure of a column of the in-memory computing circuit according to the invention.

FIG. 5b illustrates a section view of an embodiment of the thin-film structure of a column $C_k$ of four memory cells CM of the in-memory computing circuit 10 according to the invention. The materials used are shown by way of a non-limiting illustration.

The column $C_k$ comprises a first metal pillar for producing the common source line $SL_{1a}$ and a second metal pillar for producing the common intersection line $BL_{1a}$. The column further comprises a stack of four independent gate-all-around transistors separated by an insulating material IS1. Each transistor corresponds to the selection transistor T1 of a memory cell. Each transistor comprises a silicon conduction channel CC with a first end corresponding to the drain and a second end corresponding to the source. The use of gate-all-around type transistors allows the leakage currents of the structure to be significantly reduced. In addition, the gate-all-around transistors have the possibility of being stacked on top of each other in order to produce a dense structure according to the invention. The drain-side sidewall of all the transistors is covered with a series of films. The series of films comprises, in this order, a first film C'2 made of a dielectric material such as hafnium oxide ($HfO_2$), then a first metal film C'3 made of titanium (Ti), and then a second metal film made of titanium nitride (TiN), for example. The series of films obtained at each drain of a transistor T1 forms a resistive storage structure S1 corresponding to the stack of FIG. 1a. The upper electrode EL1 is formed by the whole of the first metal film made of titanium and the second metal film made of titanium nitride. The central film C2 is the film of hafnium oxide. The lower electrode EL2 corresponds to the end of the channel of the transistor T1. Advantageously, it is possible to deposit an additional metal film between the end of the channel of the transistor T1 and the first film C'2 made of a dielectric material in order to improve the electrical contact at the lower electrode EL2.

A transistor T1 and the resistive storage structure S1 connected thereto together form a memory cell CM according to the invention. A stack of four memory cells CM is thus produced.

The column $C_k$ is obtained by producing the following arrangement: the first metal pillar $SL_{1a}$ in contact with all the second ends corresponding to the source, and the second metal pillar $BL_{1a}$ in contact with all the upper electrodes EL1.

The structure presented in FIG. 5b allows the circuit according to the invention to be physically implemented with an improved geometrical density compared to the known solutions. More specifically, the in-memory computing circuit according to the invention allows a plurality of 1T1R (one transistor and one resistor) type memory cells to be implemented with a more compact three-dimensional structure compared to the known solutions.

Figure 5C:
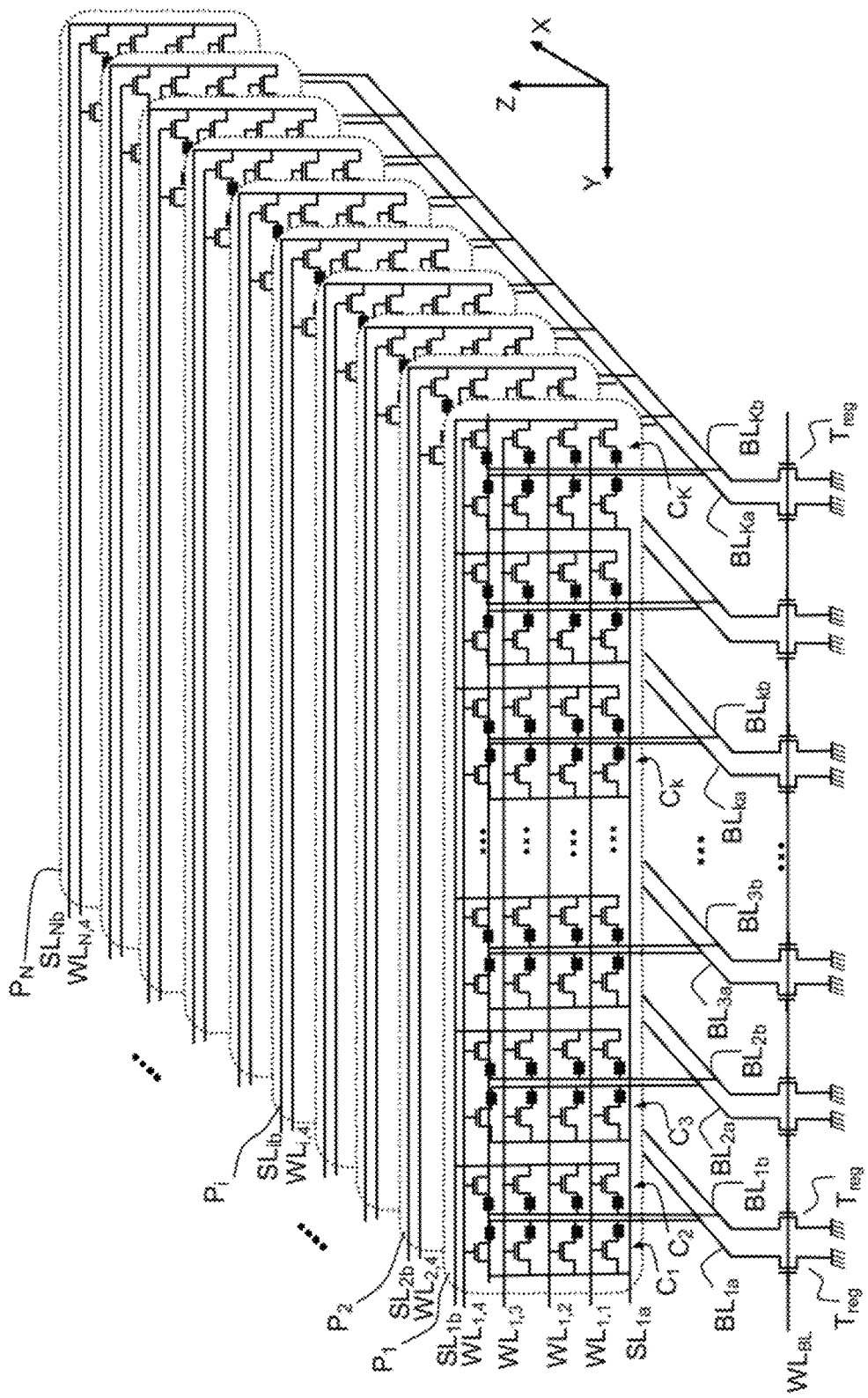
FIG. 5c illustrates a second embodiment of the in-memory computing circuit according to the invention.

FIG. 5c illustrates a second embodiment of the in-memory computing circuit according to the invention. In this embodiment, the in-memory computing circuit 10 further comprises a regulation transistor $T_{reg}$ for each interconnection line ($BL_{1a}$, $BL_{1b}$ $BL_{2a}$ $BL_{2b}$). Each regulation transistor $T_{reg}$ has a gate receiving a regulation signal $VWL_{BL}$. Each regulation transistor $T_{reg}$ connects the associated interconnection line $BL_{1a}$ to electrical ground or to a power supply voltage of the computing circuit, so as to produce a variable impedance. The impedance is controlled via the regulation signal $VWL_{BL}$ generated by the means for controlling the computing circuit 10. This allows the ratio of the divider bridge obtained by the memory cells forming an elementary group to be indirectly controlled. More specifically, when the regulation transistor $T_{reg}$ is an NMOS transistor, the transistor connects the associated interconnection line $BL_{1a}$ to electrical ground in order to lower said impedance. When the regulation transistor $T_{reg}$ is a PMOS transistor, said transistor connects the associated interconnection line $BL_{1a}$ to a node connected to the power supply voltage of the computing circuit in order to increase said impedance.

Figure 6A:
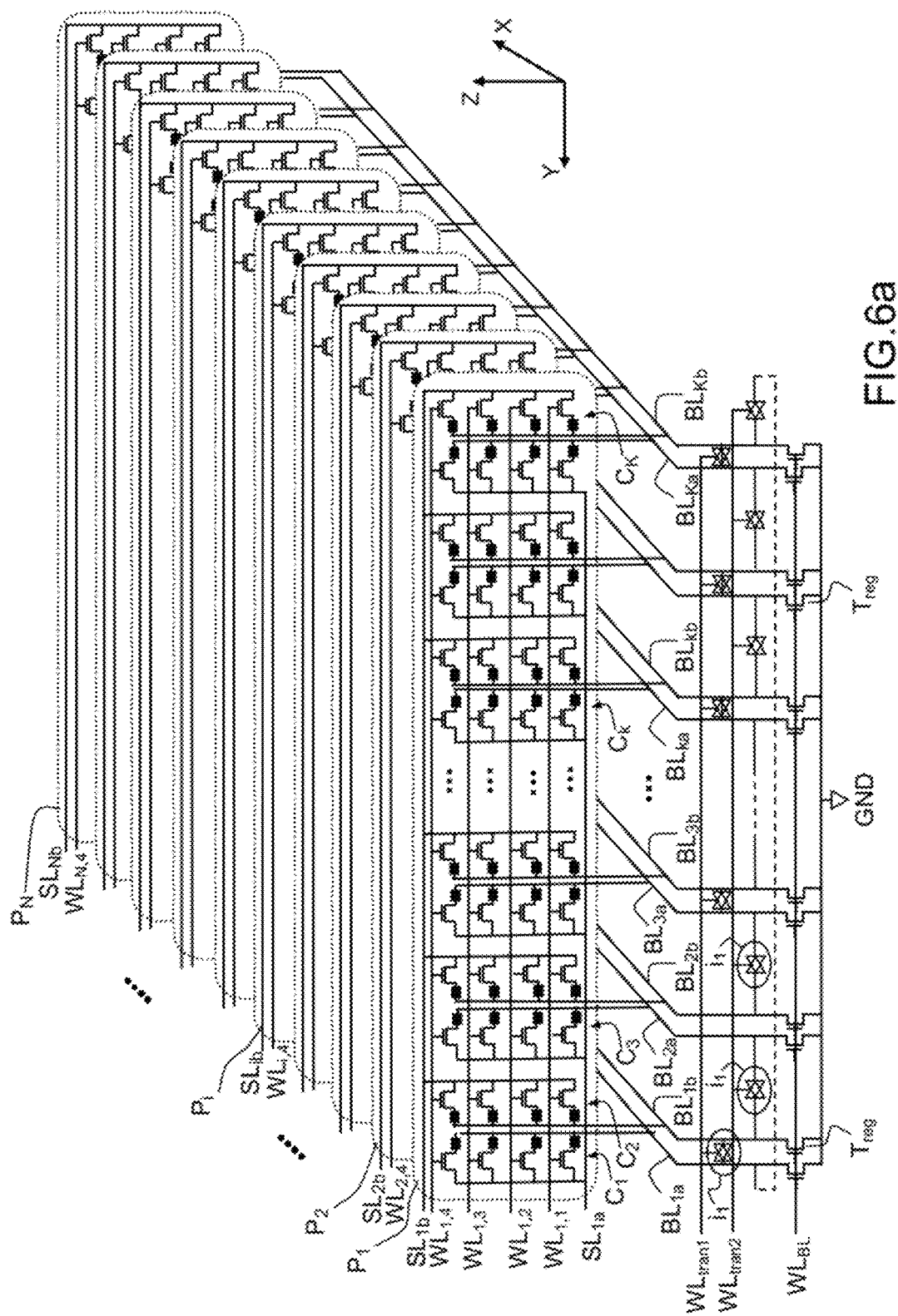
FIG. 6a illustrates a third embodiment of the in-memory computing circuit according to the invention.

FIG. 6a illustrates a third embodiment of the in-memory computing circuit according to the invention. In this embodiment, the in-memory computing circuit 10 is such that each interconnection line $BL_{ia}$ is connected to the next intersection line $BL_{ib}$ by means of a switch i1. By way of an example, the switch i1 is a pass-gate formed by two complementary transistors. Opening and closing the pass-gate is controlled by complementary signals $WL_{tran1}$ and $WL_{tran2}$ generated by the means for controlling the circuit 10. The set of switches i1 allows a function to be carried out for transferring the content stored in one memory cell to another memory cell of a different memory plane.

Figure 6B:
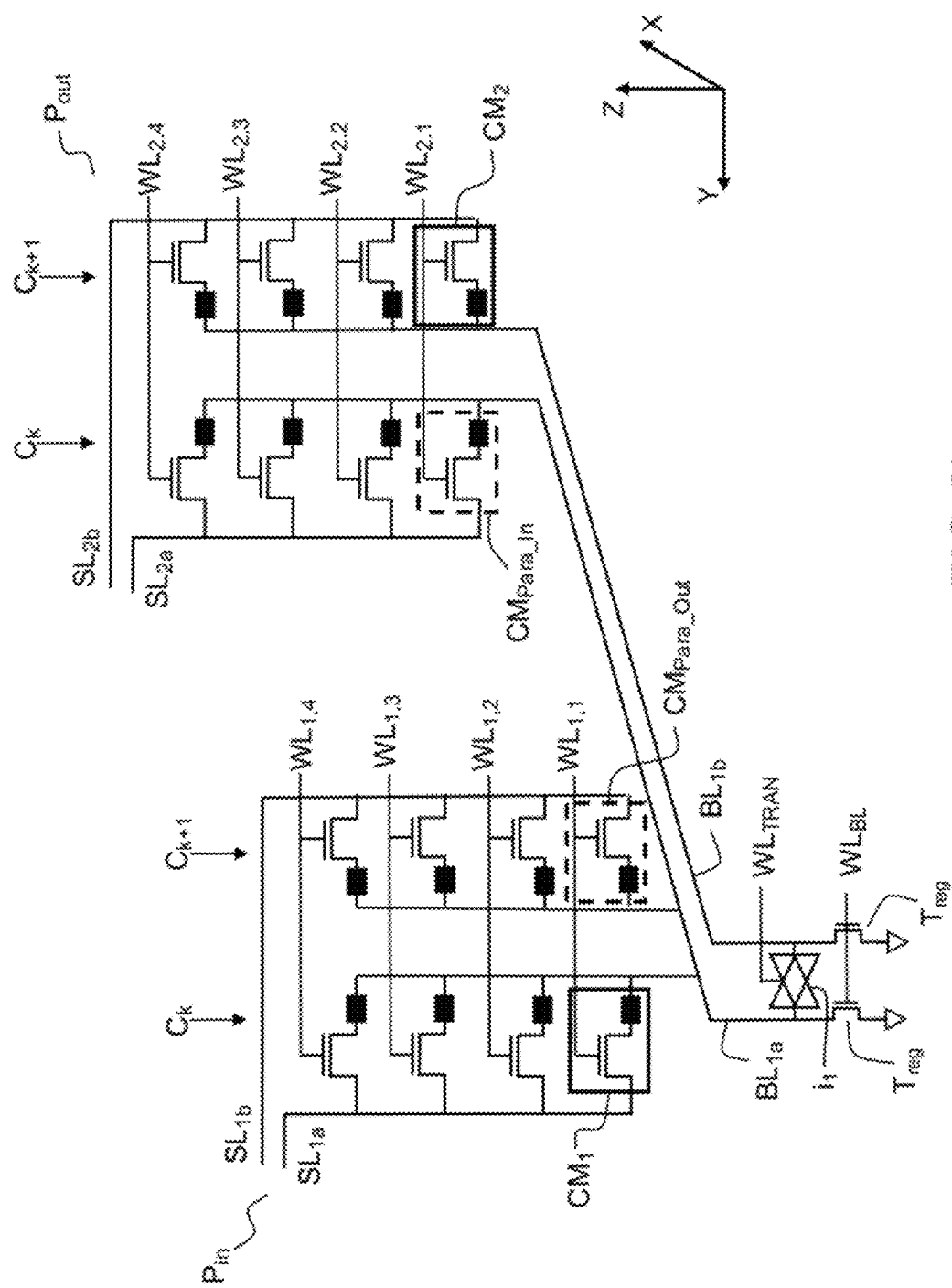
FIG. 6b illustrates an elementary group of memory cells according to a fourth embodiment of the invention intended to carry out a data transfer.

FIG. 6b illustrates an elementary group of memory cells according to a fourth embodiment of the invention intended to carry out a data transfer.

The outgoing memory cell $CM_1$ belongs to any column $C_k$ of rank k of a first plane Pin. The incoming (destination) memory cell $CM_2$ belongs to a column of rank k+1 or k−1 of a different second plane Pout. The common interconnection line $BL_{1a}$ connected to the outgoing memory cell $CM_1$ is connected to the interconnection line $BL_{1b}$ connected to the incoming memory cell $CM_2$ via a pass-gate.

Figure 6C:
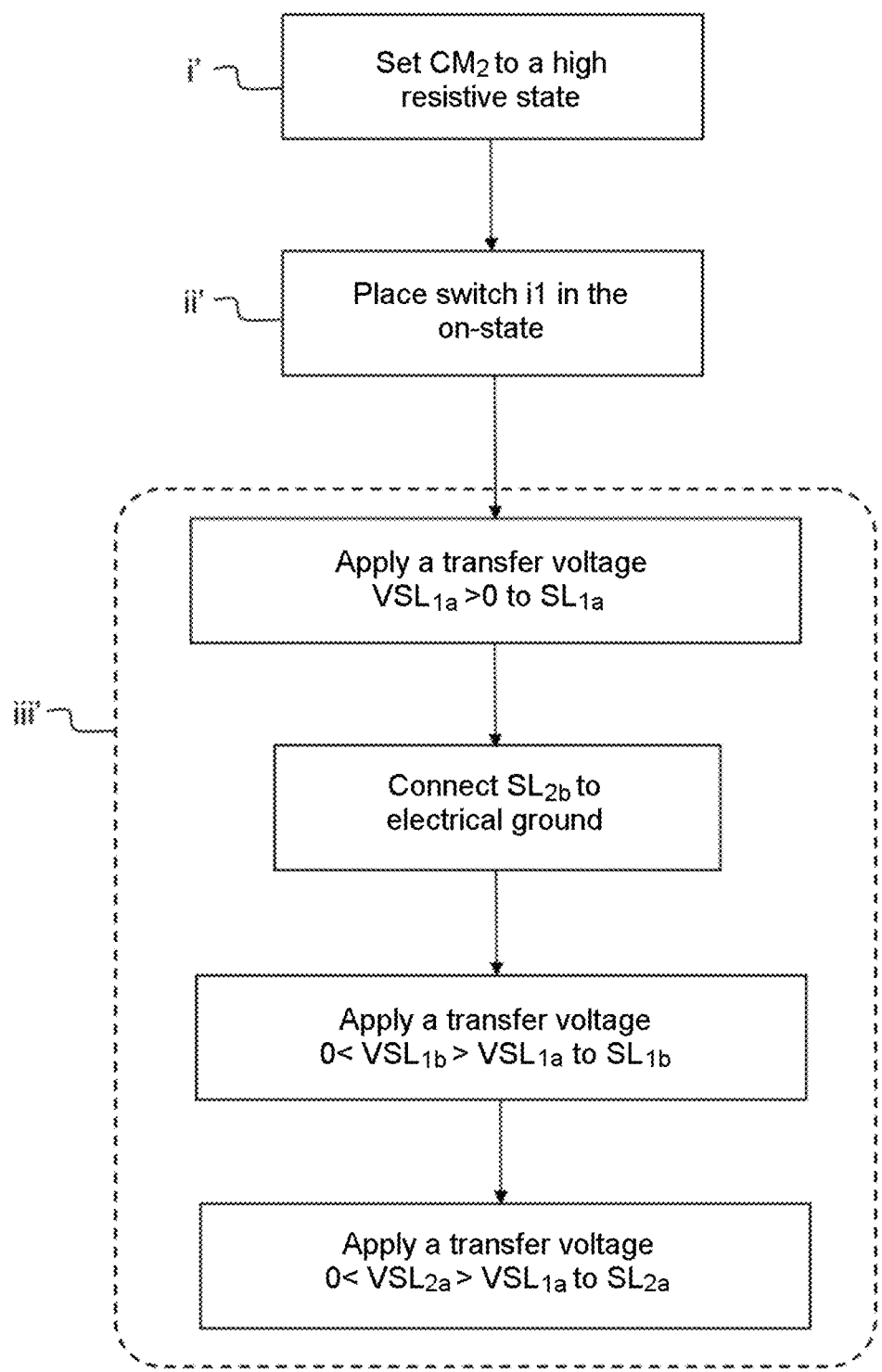
FIG. 6c illustrates the steps for carrying out a data transfer with the elementary group of memory cells according to the fourth embodiment of the invention.

FIG. 6c illustrates the steps for carrying out a data transfer with the elementary group of memory cells according to the fourth embodiment of the invention. The described transfer method allows data to be transferred while protecting the content of the memory cells $CM_{para\_out}$ and $CM_{para\_in}$ that can be affected by the transfer. The memory cell $CM_{para\_in}$ belongs to the same plane of the outgoing memory cell and is connected to the same interconnection line of the incoming memory cell $CM_{para\_out}$.

The control means are configured to transfer a stored datum from an outgoing memory cell $CM_1$ to an incoming memory cell $CM_2$.

The first step i' involves setting the incoming cell ($CM_2$) to a high resistive state.

The next step ii' involves placing the switch i1 in the on-state so as to electrically connect the interconnection line $BL_{1a}$ and the interconnection line $BL_{1b}$.

The next step iii' involves simultaneously carrying out the following operations:
 a. applying a first positive transfer voltage $VSL_{1a}$ to the first input/output node $SL_{1a}$ of the outgoing memory cell $CM_1$;
 b. connecting the first input/output node $SL_{2b}$ of the incoming memory cell $CM_2$ to electrical ground;
 c. applying a second positive transfer voltage $VSL_{1b}$ to the first input/output node $SL_{1b}$ of the memory cell $CM_{para\_in}$;
 d. applying the second positive transfer voltage to the first input/output node $VSL_{2a}$ of the memory cell $CM_{para\_out}$.

The amplitude of the first transfer voltage $VSL_{1a}$ is high enough to cause the incoming memory cell $CM_2$ to transition to a low resistive state when the outgoing memory cell is in a low resistive state (x=1). The amplitude of the second positive transfer voltage $VSL_{1b}$ is selected so as to obtain, in all cases, a voltage that is lower than the threshold voltages $V_{set}$ and $V_{reset}$ at the terminals of $CM_{para\_in}$ and $CM_{para\_out}$. Thus, the content of these two cells is maintained during the transfer. By way of an example, the first transfer voltage $VSL_{1a}$ is selected so as to be equal to the power supply voltage VDD. The second transfer voltage $VSL_{1b}$ is equal to half the power supply voltage VDD.

Thus, the possibility of transferring data from one memory plane of the in-memory computing circuit 10 according to the invention to another has been demonstrated.

Hereafter, an example of an algorithmic application of the in-memory computing circuit 10 according to the invention will be described. Hyperdimensional computing algorithms have interesting applications of the in-memory computing circuit according to the invention. This computing paradigm is based on the manipulation of large data vectors called hypervectors (having D coordinates with D>1,000). This approach can be used for classifying texts by language: a text is read sequentially letter-by-letter. Each letter is associated with a different hypervector. All the hypervectors of the letters of the text are then combined together by virtue of the elementary operations of multiplication (via the XNOR function), addition and permutation (via the transfer function) in order to create a single hypervector associated with the text. The hypervector of the text then allows the language of the text to be recognized by a comparison with reference hypervectors.

Figure 7:
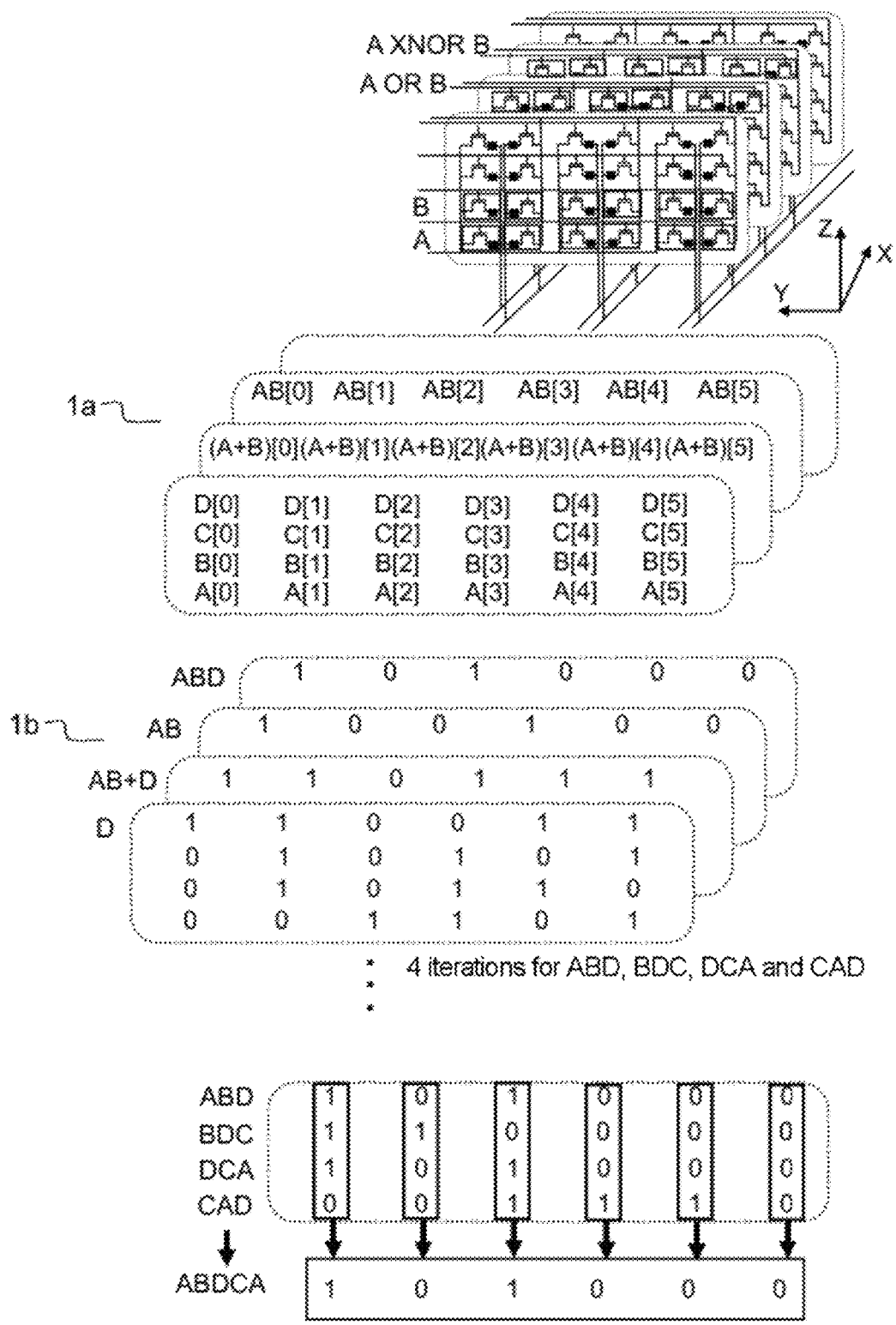
FIG. 7 illustrates the steps executed by the computing circuit according to the invention for computing the product within the meaning of the hypervectors of three data vectors.

FIG. 7 illustrates the steps carried out by the computing circuit 11 according to the invention to compute the hypervector $\underline{O}$ resulting from the following input hypervectors:

$\underline{A}$=(A[0], A[1], A[2], A[3], A[4], A[5])
$\underline{B}$=(B[0], B[1], B[2], B[3], B[4], B[5])
$\underline{C}$=(C[0], C[1], C[2], C[3], C[4], C[5])
$\underline{D}$=(D[0], D[1], D[2], D[3], D[4], D[5])

The resulting hypervector is defined by $\underline{O}$=ABDCAD=ABD+BDC+DCA+CAD.

The product between two hypervectors A and B is defined as follows:

$\underline{AB}$=(A[0]B[0], A[1]B[1], A[2]B[2], A[3]B[3], A[4]B[4], A[5]B[5]).

By way of an example, the in-memory computing circuit 11 is designed as follows: it comprises four memory planes ($P_1$, $P_2$, $P_3$, $P_4$). Each plane comprises four lines and six columns. The first plane $P_1$ is intended to store the input hypervectors. The second plane $P_2$ is intended to store the results of the OR logic operations. The third plane $P_3$ is intended to store the results of the XNOR logic operations. The fourth plane $P_4$ is intended to store the coordinates of the intermediate results ABD, BDC, DCA and CAD. The A[i] OR B[i] logic operation corresponds to the binary addition A[i]+B[i]. The A[i] XNOR B[i] logic operation corresponds to the binary multiplication A[i]·B[i].

Initially, each line of the first memory plane $P_1$ stores the coordinates of an input hypervector A, B, C, or D.

During step 1a, the computing circuit 11 is configured to simultaneously compute, in the first line of the second plane $P_2$, the results (A+B)[i]=A[i] OR B[i]. Then, the computing circuit 11 is configured to simultaneously compute, in the first line of the third plane $P_3$, the results (A·B)[i]=A[i] XNOR B[i].

During the next step 1b, the computing circuit 11 is configured to simultaneously compute, in the first line of the second plane $P_2$, the results (AB+D)[i]=AB[i] OR D[i]. Then, the computing circuit 11 is configured to simultaneously compute, in the first line of the fourth plane $P_4$, the results (A·B·D)[i]=AB[i] XNOR D[i]. The coordinates of the vector AB are computed and stored in the memory cells of the third plane $P_3$ during step 1a.

Thus, the coordinates of the vector ABD are obtained in the first line of the fourth plane $P_4$.

Then, the sequence of steps is repeated in order to compute the coordinates of the vector BDC in the second line of the fourth plane $P_4$.

Then, the sequence of steps is repeated in order to compute the coordinates of the vector DCA in the third line of the fourth plane $P_4$.

Then, the sequence of steps is repeated in order to compute the coordinates of the vector CAD in the fourth line of the fourth plane $P_4$.

Finally, the coordinates of the trigrams ABD, BDC, DCA and CAD are obtained on the fourth plane $P_4$. The last step involves computing the sum of each column in order to generate the resulting hypervector O as illustrated.

In general, the various embodiments of the in-memory computing circuit according to the invention allow any type of algorithm to be executed that involves OR and AND type elementary Boolean logic operations. In addition, a person skilled in the art can implement more complex Boolean logic operations from the results of said previously described elementary Boolean logic operations.

Figure 8:
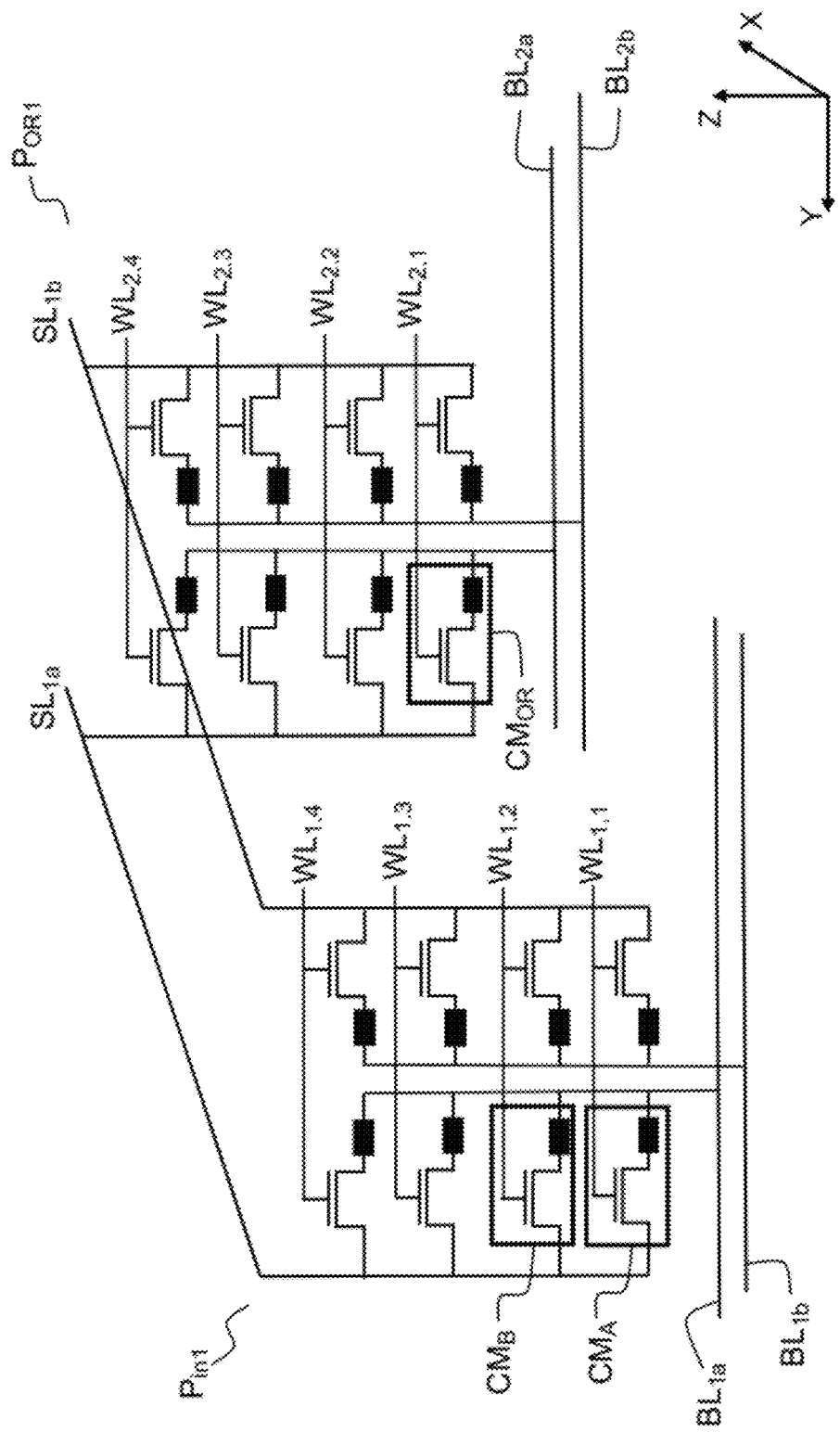
FIG. 8 illustrates an elementary group of memory cells according to a third embodiment of the invention intended to carry out the A OR B logic operation.

FIG. 8 illustrates an elementary group of memory cells according to a third embodiment of the invention intended to carry out the A OR B logic operation. The elementary group according to the third embodiment differs from that of the first embodiment as follows: the first input/output nodes SL of the first, second and third memory cells $CM_A$, $CM_B$ and $CM_{OR}$ are interconnected by a common interconnection line $SL_{1a}$. The common interconnection line in this case corresponds to the source line of the memory cells $CM_A$, $CM_B$ and $CM_{OR}$.

In the illustrated elementary group, the first memory cell $CM_A$, the second memory cell $CM_B$ and the third memory cell $CM_{OR}$ all belong to columns of the same rank in their respective matrices. In the same memory plane, the second input/output nodes BL of the memory cells belonging to the same column $C_k$ are interconnected by a common data line (or "bit line"). This embodiment can be used to carry out OR, AND type logic operations by applying a predetermined voltage set in the same way as described for the first embodiment.

REFERENCES

[1] "Memory devices and applications for in-memory computing", A. Sebastian, *Nature nanotechnology* 2020.
[2] "Four-Layer 3D Vertical RRAM Integrated with FinFET as a Versatile Computing Unit for Brain-*Inspired Cognitive Information Processing*", H. Li, et al., *Symposium on VLSI Technology Digest of Technical Papers*, 2016.

The invention claimed is:

1. An in-memory computing circuit comprising a plurality of memory planes ($P_i$) of rank i ranging from 1 to N, with N being a natural number greater than 1, each plane forming a two-dimensional matrix of non-volatile, resistive and programmable memory cells, each memory cell having a selection node (WL), a first input/output node (SL) and a second input/output node (BL), said matrix comprising M lines ($L_j$) of rank j ranging from 1 to M and K columns ($C_k$) of rank k ranging from 1 to K, with M and K being two non-zero natural numbers, said computing circuit comprising:
control means for controlling storage and in-memory computing operations carried out by the computing circuit;
at least one elementary group of memory cells comprising:
a first memory cell ($CM_A$) belonging to any one of the memory planes ($P_{in1}$) and intended to store a first input datum (A);
a second memory cell ($CM_B$) belonging to any one of the memory planes ($P_{in1}$) and intended to store a second input datum (B);
a third memory cell ($CM_{OR}$, $CM_{AND}$) belonging to a memory plane ($P_{OR1}$) different from that of the first and of the second memory cell ($CM_A$ $CM_B$), the third memory cell being intended to store the result of a first logic operation with the first and second input data as operands;
the first, second and third memory cells ($CM_A$, $CM_B$, $CM_{OR}$) belonging to columns ($C_k$) of the same rank k in their respective matrices;
the first, second and third memory cells ($CM_A$, $CM_B$, $CM_{OR}$) being interconnected by a common interconnection line ($BL_{1a}$, $SL_{1a}$);
for each memory plane ($P_i$):
the selection nodes (WL) of the memory cells belonging to the same line ($L_j$) are interconnected by a selection line ($WL_{ij}$);
the first input/output nodes (SL) of the memory cells belonging to the same column ($C_k$) are interconnected;
the second input/output nodes (BL) of the memory cells belonging to the same column ($C_k$) are interconnected.

2. The in-memory computing circuit according to claim 1, wherein each memory cell ($CM_A$, $CM_B$, $CM_{OR}$) comprises:
a programmable resistive storage structure having:
an upper electrode (EL1) connected to the second input/output node (BL) of said memory cell ($CM_A$, $CM_B$, $CM_{OR}$); and
a lower electrode (EL2);
a selection transistor (T1) having a gate connected to the selection node (WL) of said memory cell and connecting the lower electrode (EL2) to the first input/output node (SL) of said memory cell ($CM_A$, $CM_B$, $CM_{OR}$).

3. The in-memory computing circuit according to claim 2, wherein each column ($C_k$) of memory cells (CM) comprises:
a stack of a plurality of selection transistors (T1) in a first direction ($\Delta$);
each selection transistor, in particular of the gate-all-around type, comprising a conduction channel (CC), perpendicular to the first direction ($\Delta$), made of a semiconductor material and having two ends;
with the first end of the channel corresponding to the source of the selection transistor and the second end corresponding to the drain of the transistor;
a first metal pillar ($SL_{1a}$) in the first direction ($\Delta$) connecting the sources of the various selection transistors;
a dielectric film (C'2) parallel to the first direction ($\Delta$) and laterally covering the drains of the selection transistors;
at least one metal film (C'3) parallel to the first direction deposited on the dielectric film;
a second metal pillar ($BL_{1a}$) in the first direction ($\Delta$) having a lateral contact with the at least one metal film;
for each selection transistor, the assembly formed by the drain, the dielectric film (C'2) and the metal film (C'3) forms a resistive storage structure (S1).

4. The in-memory computing circuit according to claim 1, such that for each memory plane ($P_{in1}$, $P_{OR1}$):
the first input/output nodes (SL) of the memory cells belonging to the columns ($C_k$) of odd ranks are interconnected, forming a first source line ($SL_{1a}$);
the first input nodes (SL) of the memory cells belonging to the columns ($C_k$) of even ranks are interconnected, forming a second source line ($SL_{1b}$);
with the first source line and the second source line being separate.

5. The in-memory computing circuit according to claim 1, wherein the elementary group of memory cells further comprises a fourth memory cell ($CM_{XNOR}$) belonging to a memory plane different from that of the first, second and third memory cells ($CM_A$ $CM_B$, $CM_{OR}$), with the fourth memory cell being intended to store the result of a second logic operation with the first and second input data as operands and using the result of the first logic operation stored in the third memory cell ($CM_{OR}$);
the fourth memory cell ($CM_{XNOR}$) being connected to the first, second and third memory cells ($CM_A$ $CM_B$, $CM_{OR}$) via the common interconnection line ($BL_{1a}$, $SL_{1a}$).

6. The in-memory computing circuit according to claim 1, wherein, for each elementary group of memory cells, the interconnection line ($BL_{1a}$) connects together the second input/output nodes (BL) of the memory cells of said elementary group.

7. The in-memory computing circuit according to claim 1, wherein the first logic operation is an OR Boolean function.

8. The in-memory computing circuit according to claim 7, wherein the control means are configured to carry out the following steps in order to carry out the OR logic function:
i—setting the third cell to a high resistive state;
ii—selecting the first and the third memory cell ($CM_A$, $CM_{OR}$) by placing their selection transistors (T1) in the on-state;
iii—applying a first positive read voltage to the first input/output node ($SL_{1a}$) of the first memory cell and simultaneously connecting the first input/output node ($SL_{2a}$) of the third memory cell to electrical ground;

iv—selecting the second and the third memory cell ($CM_B$, $CM_{OR}$) by placing their selection transistors (T1) in the on-state;
v—applying the first positive read voltage to the first input/output node ($SL_{1a}$) of the first memory cell and simultaneously connecting the first input/output node ($SL_{2a}$) of the third memory cell to electrical ground;
with each memory cell having:
a first voltage threshold ($V_{set}$) in order to transition from a high resistive state to a low resistive state, and a second voltage threshold ($V_{reset}$) in order to transition from a low resistive state to a high resistive state greater than the first voltage threshold ($V_{set}$);
said first read voltage being positive with an amplitude greater than or equal to the first transition threshold and strictly less than the second transition threshold.

9. The in-memory computing circuit according to claim 6, wherein the first logic operation is an OR Boolean function, and wherein the second logic operation is an exclusive NOR (XNOR) Boolean function.

10. The in-memory computing circuit according to claim 9, wherein the control means are configured to carry out the following steps in order to carry out the exclusive NOR (XNOR) logic function:
i—setting the fourth cell to a low resistive state;
ii—selecting the first, the third and the fourth memory cell ($CM_A$, $CM_{OR}$, $CM_{XNOR}$) by placing their transistors in the on-state;
iii—simultaneously carrying out the following:
  a. applying a second positive read voltage ($VSL_{1a}$) to the first input/output node ($SL_{1a}$) of the first memory cell ($CM_A$);
  b. applying a third negative read voltage ($VSL_{2a}$) to the first input/output node ($SL_{2a}$) of the third memory cell ($CM_{OR}$); and
  c. applying a fourth positive read voltage ($VSL_{3a}$) to the first input/output node ($SL_{3a}$) of the fourth memory cell ($CM_{XNOR}$);
iv—selecting the second, the third and the fourth memory cell ($CM_B$, $CM_{OR}$, $CM_{XNOR}$) by placing their selection transistors (T1) in the on-state;
v—simultaneously carrying out the following:
  a—applying the second positive read voltage ($VSL_{1a}$) to the first input/output node ($SL_{1a}$) of the second memory cell ($CM_B$);
  b—applying the third negative read voltage ($VSL_{2a}$) to the first input/output node ($SL_{2a}$) of the third memory cell ($CM_{OR}$); and
  c—applying a fourth positive read voltage ($VSL_{3a}$) to the first input/output node ($SL_{3a}$) of the fourth memory cell ($CM_{XNOR}$);
with the absolute value of the third read voltage ($VSL_{2a}$) being substantially equal to the absolute value of the second read voltage ($VSL_{1a}$);
with the sum of the absolute value of the fourth read voltage ($VSL_{3a}$) and of the third read voltage ($VSL_{2a}$) being greater than the second transition threshold ($V_{reset}$).

11. The in-memory computing circuit according to claim 1, wherein the first logic operation is an AND Boolean function.

12. The in-memory computing circuit according to claim 1, comprising, for each interconnection line ($BL_{1a}$, $BL_{1b}$ $BL_{2a}$ $BL_{2b}$), a regulation transistor ($T_{reg}$), with each regulation transistor ($T_{reg}$) having a gate receiving a regulation signal ($VWL_{BL}$) and connecting the associated interconnection line to electrical ground or to a power supply voltage of the computing circuit, so as to achieve a variable impedance.

13. The in-memory computing circuit according to claim 1, comprising a plurality of elementary groups of memory cells, with each interconnection line ($BL_{1a}$, $BL_{1b}$ $BL_{2a}$ $BL_{2b}$) being connected to an adjacent interconnection line ($BL_{1a}$, $BL_{1b}$ $BL_{2a}$ $BL_{2b}$) by means of a switch (i1).

14. The in-memory computing circuit according to claim 13, wherein the control means are configured to transfer a stored datum from an outgoing memory cell ($CM_1$) to an incoming memory cell ($CM_2$) belonging to a plane different from that of the outgoing memory cell and connected to an interconnection line adjacent to that of the outgoing memory cell;
the transfer is carried out by executing the following steps:
i'—setting the incoming cell ($CM_2$) to a high resistive state;
ii' placing the switch i1 in the on-state;
iii' simultaneously carrying out the following:
  a. applying a first positive transfer voltage to the first input/output node ($SL_{1a}$) of the outgoing memory cell ($CM_1$);
  b. connecting the first input/output node ($SL_{2b}$) of the incoming memory cell to electrical ground;
  c. applying a second positive transfer voltage to the first input/output node ($SL_{1b}$) of the memory cell ($CM_{para\_in}$) belonging to the same plane of the outgoing memory cell and connected to the same interconnection line of the incoming memory cell;
  d. applying the second positive transfer voltage to the first input/output node ($SL_{2a}$) of the memory cell ($CM_{para\_out}$) belonging to the same plane of the incoming memory cell and connected to the same bit line of the outgoing memory cell;
with the amplitude of the second transfer voltage being less than or equal to half the first transfer voltage.

15. The in-memory computing circuit according to claim 1, wherein, for each elementary group of memory cells, the interconnection line ($SL_{1a}$) connects together the first input/output nodes (SL) of the memory cells of said elementary group.

* * * * *